United States Patent
Ghandi et al.

(10) Patent No.: US 10,121,971 B2
(45) Date of Patent: Nov. 6, 2018

(54) CELLULOSE-POLYMER COMPOSITES FOR SOLAR CELLS

(71) Applicant: CHEMGREEN INNOVATION INC., Sackville (CA)

(72) Inventors: Khashayar Ghandi, Sackville (CA); Yang Tan, Sackville (CA); Fraser Burns, Sackville (CA); Sean Robertson, Sackville (CA); Zahid Shabbir Mahimwalla, Sackville (CA)

(73) Assignee: ChemGreen Innovation Inc., Sackville, New Brunswick (CA)

( * ) Notice: Subject to any disclaimer, the term of this patent is extended or adjusted under 35 U.S.C. 154(b) by 85 days.

(21) Appl. No.: 14/409,821

(22) PCT Filed: Jun. 21, 2013

(86) PCT No.: PCT/CA2013/000596
§ 371 (c)(1),
(2) Date: Dec. 19, 2014

(87) PCT Pub. No.: WO2013/188966
PCT Pub. Date: Dec. 27, 2013

(65) Prior Publication Data
US 2015/0188054 A1    Jul. 2, 2015

Related U.S. Application Data

(60) Provisional application No. 61/662,546, filed on Jun. 21, 2012.

(51) Int. Cl.
*C08L 1/02* (2006.01)
*H01L 51/00* (2006.01)
(Continued)

(52) U.S. Cl.
CPC .......... *H01L 51/0041* (2013.01); *B82Y 10/00* (2013.01); *C08B 1/003* (2013.01);
(Continued)

(58) Field of Classification Search
CPC combination set(s) only.
See application file for complete search history.

(56) References Cited

U.S. PATENT DOCUMENTS

| | | |
|---|---|---|
| 4,812,520 A | 3/1989 | Zeigler |
| 6,291,606 B1 | 9/2001 | Tang et al. |

(Continued)

FOREIGN PATENT DOCUMENTS

| | | |
|---|---|---|
| CA | 1296500 | 3/1992 |
| CA | 2156239 | 8/1995 |
| CA | 2614255 | 1/2007 |

OTHER PUBLICATIONS

Brabec, Christoph J. et al. Plastic Solar Cells. Advanced Functional Materials. 11(1):15-26, 2001.

(Continued)

*Primary Examiner* — Michael A Salvitti
(74) *Attorney, Agent, or Firm* — Bereskin & Parr LLP/S.E.N.C.R.L., s.r.l.; Michael Fenwick

(57) ABSTRACT

The present disclosure relates to a cellulose-polymer composite solar cell that is substantially biodegradable and fabricated using environmentally friendly materials and methods. The polymer solar cell comprises an electrically conductive cellulose-polymer composite and an electrically semiconductive cellulose-polymer composite.

27 Claims, 21 Drawing Sheets

(51) Int. Cl.
*C08F 38/00* (2006.01)
*C08B 1/00* (2006.01)
*C08L 1/08* (2006.01)
*C08L 25/06* (2006.01)
*H01L 51/42* (2006.01)
*H01B 1/12* (2006.01)
*C08L 65/00* (2006.01)
*C08J 3/09* (2006.01)
*B82Y 10/00* (2011.01)
*H01L 51/44* (2006.01)
*C08G 61/12* (2006.01)

(52) U.S. Cl.
CPC ............... *C08F 38/00* (2013.01); *C08J 3/098* (2013.01); *C08L 1/02* (2013.01); *C08L 1/08* (2013.01); *C08L 25/06* (2013.01); *C08L 65/00* (2013.01); *H01B 1/127* (2013.01); *H01B 1/128* (2013.01); *H01L 51/0034* (2013.01); *H01L 51/424* (2013.01); *H01L 51/44* (2013.01); *H01L 51/441* (2013.01); *C08G 61/124* (2013.01); *C08G 2261/312* (2013.01); *C08G 2261/3142* (2013.01); *C08G 2261/3221* (2013.01); *C08G 2261/3223* (2013.01); *C08G 2261/3241* (2013.01); *C08G 2261/3422* (2013.01); *C08J 2301/02* (2013.01); *H01L 51/0093* (2013.01); *Y02E 10/549* (2013.01)

(56) References Cited

U.S. PATENT DOCUMENTS

| | | | | |
|---|---|---|---|---|
| 2006/0021647 A1* | 2/2006 | Gui | ............... | B82Y 10/00 136/252 |
| 2006/0203322 A1* | 9/2006 | Radmard | ............... | G02F 1/1525 359/265 |
| 2006/0226396 A1* | 10/2006 | Majumdar | ............... | C08K 5/0091 252/500 |
| 2008/0190321 A1* | 8/2008 | Maase | ............... | C08B 1/003 106/200.2 |
| 2008/0209876 A1* | 9/2008 | Miller | ............... | G11C 13/0009 55/522 |
| 2009/0296317 A1* | 12/2009 | Naoi | ............... | H01G 9/0032 361/504 |
| 2012/0082901 A1* | 4/2012 | Schmidt | ............... | H01M 4/133 429/308 |
| 2012/0175564 A1* | 7/2012 | Jin | ............... | H01B 1/127 252/500 |
| 2012/0220740 A1* | 8/2012 | Geremia | ............... | C08F 212/08 526/259 |
| 2012/0305491 A1* | 12/2012 | Ghandi | ............... | B03C 1/01 210/695 |
| 2013/0140531 A1* | 6/2013 | Park | ............... | H01L 51/0097 257/40 |
| 2015/0188054 A1* | 7/2015 | Ghandi | ............... | C08F 38/00 136/263 |
| 2016/0040360 A1* | 2/2016 | Li | | |
| 2016/0087306 A1* | 3/2016 | Lee | ............... | H01M 10/0565 429/317 |

OTHER PUBLICATIONS

Douglas, William E. Solvent-free oligomerization of phenylacetylene catalyzed by (cyclopentadienyl)nickel complexes. J. Chem. Soc. Dalton Trans. pp. 57-62, 2000.
Douglas, William E. Polymerization of phenylacetylene catalysed by cyclopentadienylnickel complexes. Appl. Organometal Chem. 2001; 15: 23-26, 2001.
Levy, Ari. Drawing the Curtains to let in the Sun. Bloomberg Businessweek. p. 40, 2012.
Nyholm, Leif et al. Toward Flexible Polymer and Paper-Based Energy Devices. Adv. Mater. 23:3751-3769, 2011.
Shi, Zhijun et al. Nanocellulose Electroconductive Composites. Nanoscale, 5:3194-3201, 2013.
Trzeciak, Anna M. et al. Polymerization of phenylacetylene catalysed by RhTp(cod) and RhBp(cod) in ionic liquids: effect of alcohols and of tetraammonium halides. Appl. Organometal. Chem. 18:124-129, 2004.
Zhu, Yinhua, Recyclable Organic Solar Cells on Cellulose Nanocrystal Substrates. Scientific Reports. 3:1536, 1-5, 2013.
Gang, L et al. Polymer Solar Cells. Nature Photonics, 6:153-161, 2012.
Cheng, Y.J. et al. Chem Rev 109:5868, 2009.
Moliton, A. et al. Polym Int 53:1397, 2004.
Deibel, C. et al. Rep Prog Phys 73:096401, 2010.
Dennler, M.C. et al. Adv Mater 21:1, 2009.
Thompson et al. Chem Int Ed 47:58, 2008.
Jenekhe, S.A. Appl. Phys. Lett. 77:2635, 2000.
Yu, G. et al. J. Appl. Phys. Lett. 78:4510, 1995.
Granström, M. et al. Nature 395:257, 1998.
Halls, J.J.M. et al. Synth. Met. 85, 1307, 1997.
Sariciftci, N.S. et al. Appl. Phys. Lett. 62:585, 1993.

* cited by examiner (A)

Probe Closed (B)

Probe Opened

CELLULOSE-POLYMER COMPOSITES FOR SOLAR CELLS

CROSS REFERENCE TO RELATED APPLICATIONS

This is a national stage application of PCT/CA2013/000596, filed Jun. 21, 2013, which claims priority from U.S. Provisional patent application Ser. No. 61/662,546 filed Jun. 21, 2012, all of which are incorporated herein by reference in their entirety.

FIELD

The present disclosure relates to a polymer solar cell, and a method of manufacturing the same. In particular, the disclosure relates to a polymer solar cell comprising an electrically conductive polymer composite and a composite polymer semiconductor, where both composites are cellulose based.

INTRODUCTION

Silicon solar cells dominate the photovoltaic market, most of which are rather expensive and relatively rigid. Organic photovoltaic devices offer great technological potential as a renewable and alternative source of electrical energy in contrast to conventional silicon photovoltaic devices. The processes to make the components of most organic photovoltaic devices however are not environmentally friendly and also often use liquid electrolytes. Unfortunately, the liquid electrolyte presents several technological problems such as solvent evaporation and leakage of the volatile solvent and the redox couple. These problems limit the long-term stability of these wet organic solar cells.

Polymer solar cells (PSCs) are within the class of organic solar cells. In organic solar cells bound electron-hole pairs (excitons) are strongly bound after excitation with light.[1-6] Strongly bound excitons exist in these materials as a consequence of the low dielectric constants in the organic components.[6] In excitonic solar cells, exciton dissociation occurs at the interface between two materials of differing electron affinities: the electron donor and the electron acceptor.[6] To have sufficient photocurrent in these solar cells, an appropriate donor-acceptor pair and device architecture is selected.[6]

Recent progress in the development of PSCs has improved power-conversion efficiencies from 3% to almost 10%.[1] Based on semiconducting polymers, these solar cells are fabricated from solution-processing techniques and have unique prospects for achieving low-cost solar energy harvesting, owing to their material and manufacturing advantages.[1] There have been several recent and relevant efforts in the last few years on the design and synthesis of active layer polymeric materials,[2] their electronic and optical properties[3] and polymer-Multi-Walled Carbon Nanotubes bulk heterojunction (BHJ) solar cells.[4-6] There have also been significant efforts earlier to develop donor-acceptor bilayers,[7-10] which is commonly achieved by vacuum deposition of molecular components.[11]

SUMMARY

The present disclosure includes a polymer solar cell that has components which are biodegradable, and which are fabricated using environmentally friendly materials and methods.

In one embodiment, the polymer solar cell comprises:
a. a first electrode, comprising an electrically conductive polymer composite, wherein the electrically conductive polymer composite comprises:
  a.i. cellulose or a cellulose derivative;
  a.ii. a conductive polymer or conductive polymer composite; and
  a.iii. optionally, a dopant;
b. a second electrode, comprising a composite polymer semiconductor, wherein the composite polymer semiconductor comprises:
  b.i. cellulose or a cellulose derivative;
  b.ii. polyphenylacetylene or a derivative thereof, or polystyrene or a derivative thereof wherein the polystyrene is a nano-composite made of polystyrene or its derivatives and metal nanoparticle; and
  b.iii optionally, a second dopant;
wherein the first electrode is in contact with the second electrode. In one embodiment, the first electrode is a cathode, and the second electrode is an anode. In one embodiment, the first electrode is an anode, and the second electrode is a cathode. There is optionally a film of ionic liquid, optionally with a dissolved carbon-based compound such as a fullerene including a multi-walled carbon nanotube, on the cathode to help to prevent short circuit of the solar cell.

In one embodiment, the polymer solar cell comprises:
a. a cathode (an electron accepting, positive electrode), comprising an electrically conductive polymer composite, wherein the electrically conductive polymer composite comprises:
  a.i. cellulose or a cellulose derivative;
  a.ii. a conductive polymer or conductive polymer composite; and
  a.iii. optionally, a dopant;
b. an anode (an electron donating, negative electrode) comprising a composite polymer semiconductor, wherein the composite polymer semiconductor comprises:
  b.i. cellulose or a cellulose derivative;
  b.ii. polyphenylacetylene or a derivative thereof, or polystyrene or a derivative thereof wherein the polystyrene is a nano-composite made of polystyrene or its derivatives and metal nanoparticle; and
  b.iii optionally, a second dopant;
wherein the anode is in contact with the cathode. There is optionally a film of ionic liquid, optionally with a dissolved carbon-based compound such as a fullerene including a multi-walled carbon nanotube, on the cathode to help to prevent short circuit of the solar cell.

The polymer composites in the cathode and anode are useful as novel membranes in novel low temperature fuel cells, electrochemical actuators, paper display and in electro-ultrafiltration.

In another embodiment, the electrically conductive polymer composite has a surface resistivity of less than 10 Ohm/Sq, for example between 0.0001 and 10 Ohm/Sq, optionally, 0.1 and 10 Ohm/Sq. In another embodiment, the composite polymer semiconductor has a surface resistivity of between 10 Ohm/Sq and $10^8$ Ohm/Sq, optionally 10 Ohm/Sq and $10^6$ Ohm/Sq.

In some embodiments, as the cathode of the polymer solar cells comprise cellulose, the polymer solar cells are fabricated by simply depositing the anode on the cathode coated with an ionic liquid.

The present disclosure also includes a process for the solvent-free preparation of polyphenylacetylene polymer or a derivative thereof, comprising polymerizing phenylacetylene or a phenylacetylene derivative in the presence of a free radical initiator, under conditions for the solvent-free polymerization of the phenylacetylene or phenylacetylene derivative, wherein the polyphenylacetylene or derivative thereof is prepared in greater than 70% yield. In one embodiment, the phenylacetylene or a phenylacetylene derivative is prepared in six hours, five hours, or four hours or less.

The present disclosure also includes a composite polymer semiconductor, comprising: (i) cellulose or a cellulose derivative; and (ii) polyphenylacetylene or a polyphenylacetylene derivative.

Other features and advantages of the present application will become apparent from the following detailed description. It should be understood, however, that the detailed description and the specific examples while indicating preferred embodiments of the application are given by way of illustration only, since various changes and modifications within the spirit and scope of the application will become apparent to those skilled in the art from this detailed description.

DRAWINGS

The disclosure will now be described in greater detail with reference to the following drawings in which.

DESCRIPTION OF VARIOUS EMBODIMENTS (I) Definitions

Figure 1:
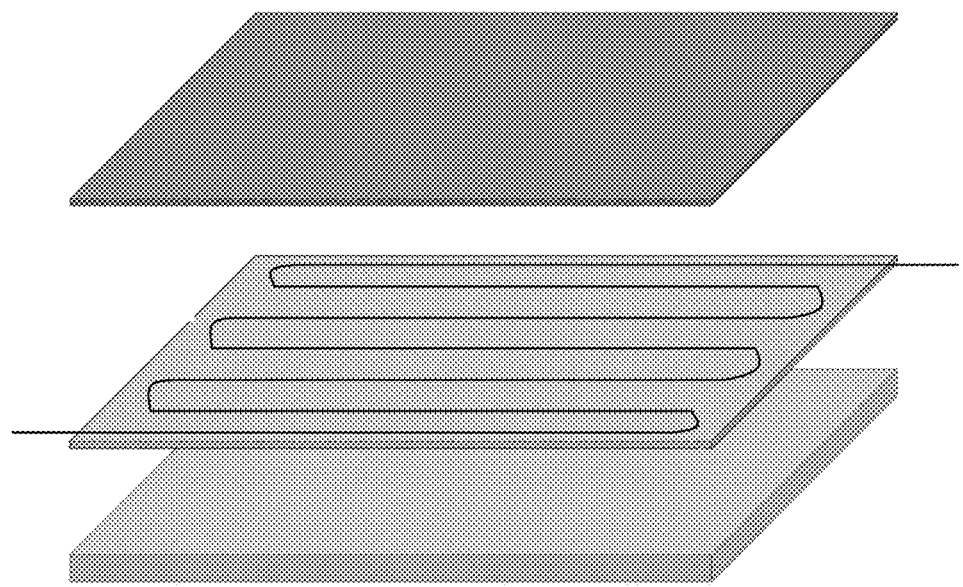
FIG. 1 is a schematic representation of a polymer solar cell of the present disclosure.
Figure 2:
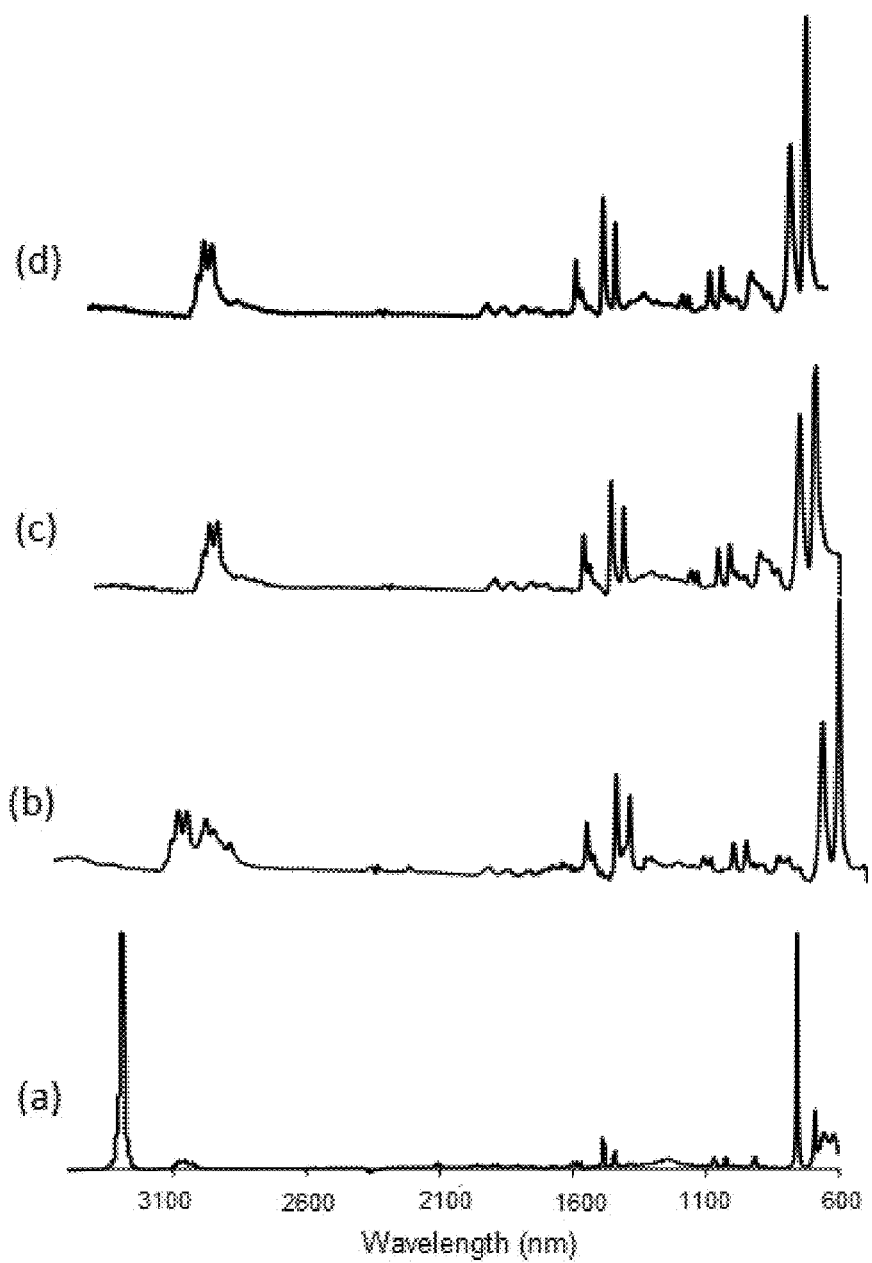
FIG. 2 is an infrared spectra of polyphenylacetylene prepared in accordance with embodiments of the present disclosure.
Figure 3:
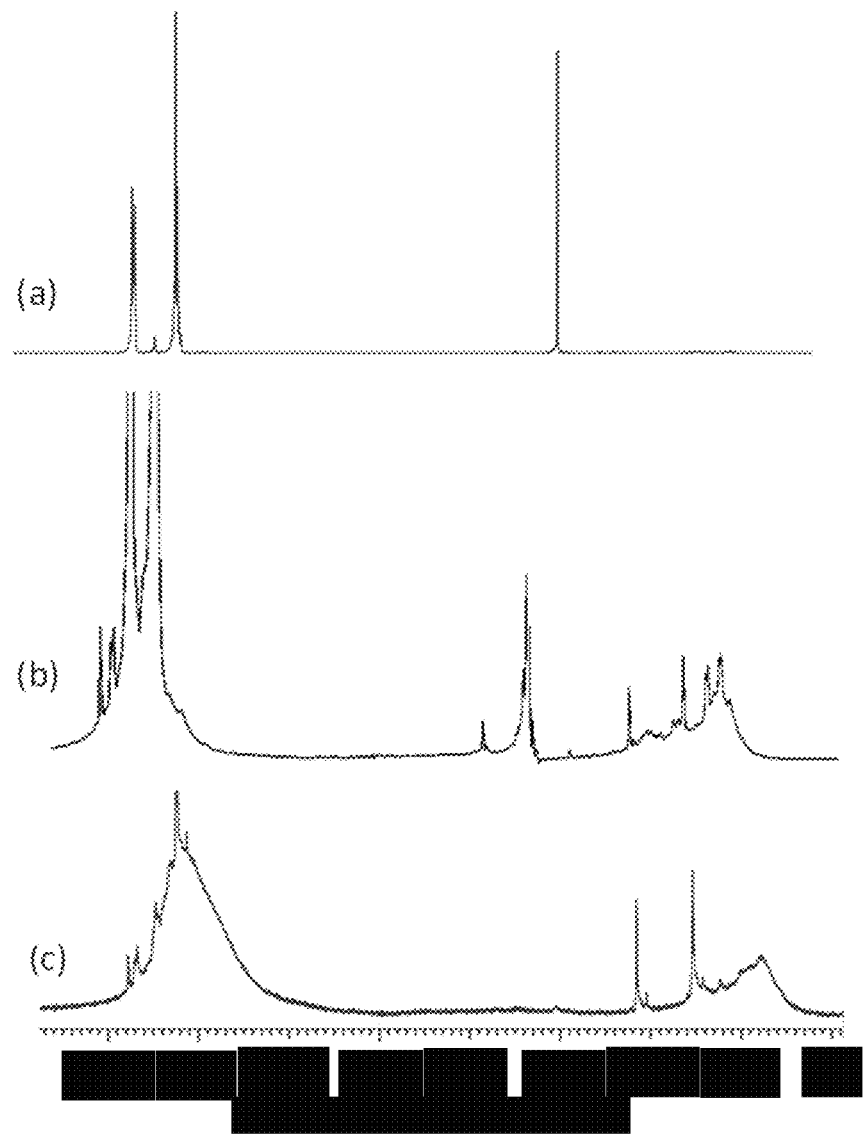
FIG. 3 is an $^1$HNMR spectra of polyphenylacetylene prepared in accordance with embodiments of the present disclosure.
Figure 4:
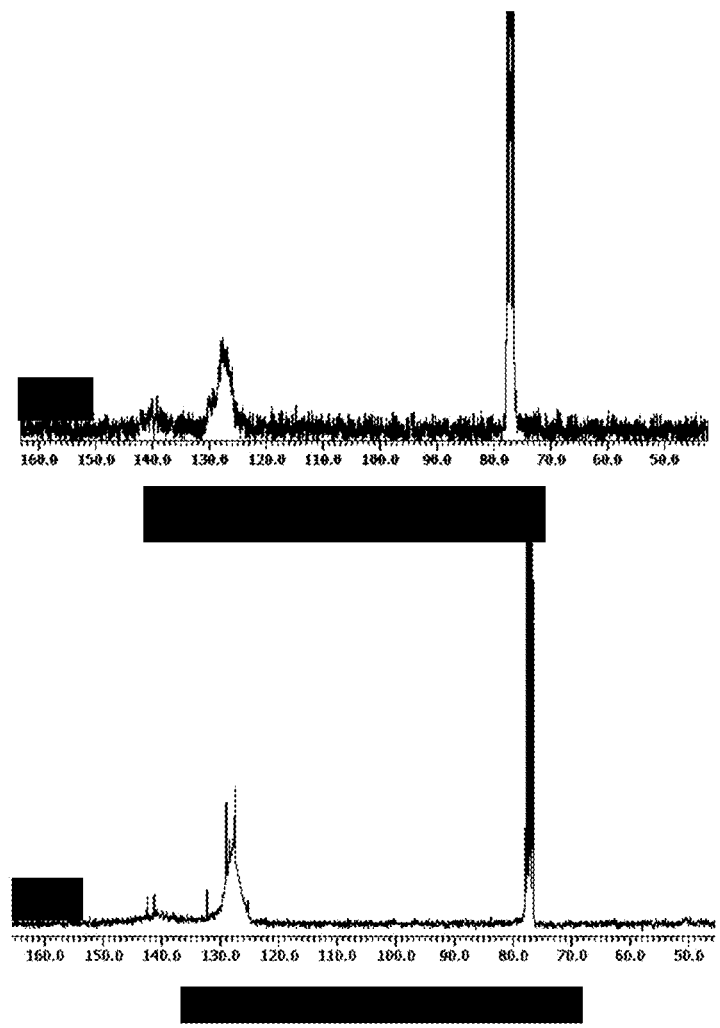
FIG. 4 is an $^{13}$CNMR spectra of polyphenylacetylene prepared in accordance with embodiments of the present disclosure.
Figure 5:
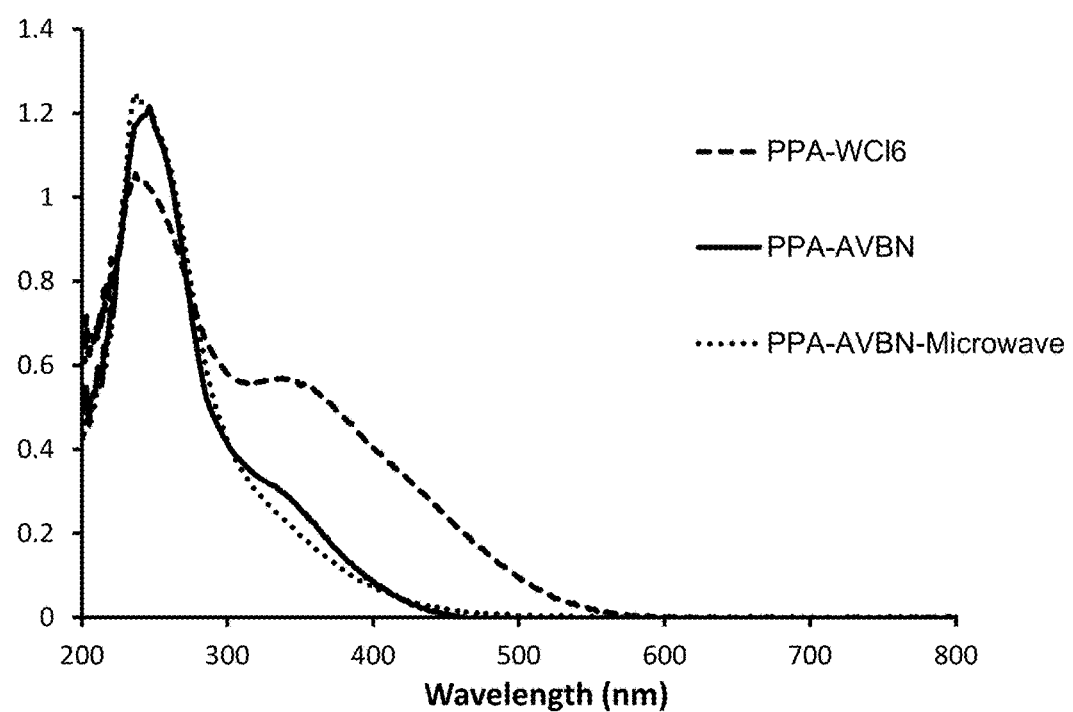
FIG. 5 is a UV-Vis spectra of polyphenylacetylene prepared in accordance with embodiments of the present disclosure.
Figure 6:
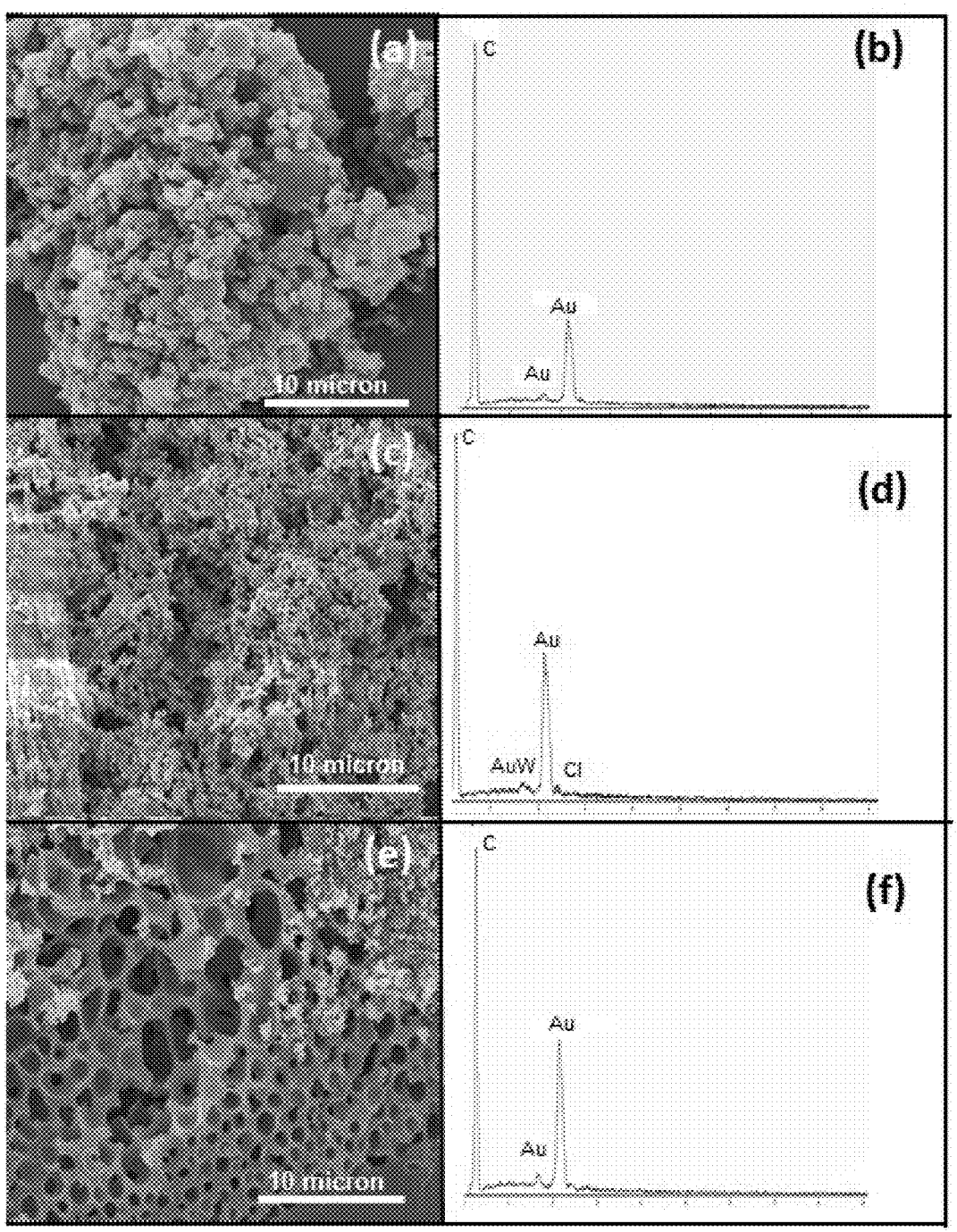
FIG. 6 shows scanning electron micrographs of polyphenylacetylene prepared in accordance with embodiments of the present disclosure.

The term "composite" as used herein means a material which is composed of two or more substances having different physical characteristics and in which each substance retains some of its identity while contributing desirable properties to the whole. For example, cellulose (or a cellulose derivative) in combination with a conductive organic polymer form an electrically conductive polymer composite, wherein cellulose is biodegradable and a conductive organic polymer conducts current flow.

The terms "conductive polymer" or "conductive polymer composite" as used herein refers to a polymer or polymer composite which is capable of conducting electricity and/or upon being doped with a dopant.

The term "cellulose" as used herein is a long-chain polymer polysaccharide carbohydrate comprised of β-glucose monomer units, of formula $(C_6H_{10}O_5)_n$, usually found in plant cell walls in combination with lignin and any hemicellulose, and therefore, the term cellulose also includes hemicellulose. Sources of cellulose include any plant material containing cellulose, paper-products, waste streams containing cellulose, such as carbohydrate waste etc.

The term "derivative" as used herein refers to a substance which comprises the same basic carbon skeleton and functionality as the parent compound, but can also bear one or more substituents or substitutions of the parent compound. For example, ester derivatives of cellulose would include any compounds in which, in one embodiment, free hydroxyl groups of any of the sugar moieties have been esterified (e.g. methyl esters, ethyl esters, benzyl esters etc.).

The term "$C_{1-n}$-alkyl" as used herein means straight and/or branched chain, saturated alkyl radicals containing from one to "n" carbon atoms and includes (depending on the identity of n) methyl, ethyl, propyl, isopropyl, n-butyl, s-butyl, isobutyl, t-butyl and the like, where the variable n is an integer representing the largest number of carbon atoms in the alkyl radical.

The term "$C_{1-6}$-alkoxy" as used herein refers to alkyl groups as defined above attached to a molecule through an oxygen.

The term "aryl" as used herein means a monocyclic, bicyclic or tricyclic aromatic ring system containing, depending on the number of atoms in the rings, for example from 6 to 14 carbon atoms, and at least 1 aromatic ring and includes phenyl, naphthyl, anthracenyl, 1,2-dihydronaphthyl, 1,2,3,4-tetrahydronaphthyl, fluorenyl, indanyl, indenyl and the like.

The term "heteroaryl" or "heteroaromatic" as used herein means a monocyclic, bicyclic or tricyclic ring system containing one or two aromatic rings, and from 5 to 14 atoms, optionally 5 or 6 atoms, of which, unless otherwise specified, one, two, three, four or five are a heteromoiety independently selected from N, NH, $NC_{1-6}$alkyl, O and S and includes thienyl, furyl, pyrrolyl, pyrididyl, indolyl, quinolyl, isoquinolyl, tetrahydroquinolyl, benzofuryl, benzothienyl and the like.

The term "halo" as used herein means halogen and includes chloro, fluoro, bromo and iodo.

The term "fluoro-substituted $C_{1-2}$alkyl" as used herein that at least one (including all) of the hydrogens on the referenced group is replaced with fluorine.

The term "biodegradable" as used herein refers to a polymer solar cell which may be broken down, or substantially broken down, into organic substances by living organisms, for example, microorganisms. In certain embodiments, polymer solar cells of the present disclosure will include compounds, such as polymers, dopants, which are not wholly biodegradable. However, the content of such non-biodegradable compounds of the polymer solar cells is considered to only negligibly affect the biodegradable character of the overall polymer solar cell.

The term "contact" as used herein refers to the interfacial surface area of the electrically conductive polymer composite and the composite polymer semiconductor (the anode and the cathode). Upon excitation of the composite polymer semiconductor, the charge carrier (for example an electron) carrying the charge is transferred to the electrically conductive polymer composite. The dopant as a component of the composite polymer semiconductor helps in this charge transfer. The ability of the composite polymer semiconductor and the electrically conductive polymer composite to transfer charge carriers and in particular electrons therefore make them act as a cathode and an anode, respectively, to generate a current flow.

The term "solvent-free" as used herein refers to a polymerization process in which no external solvent component has been added to the process. It is understood by one of ordinary skill that residual solvents may be present inherently in commercially available or synthesized products, which inherent presence is not precluded by the use of the term.

The term "dopant" or "electrically conductive dopant" as used herein refers to a substance which is added to a polymer or polymer composite of the present disclosure to alter, or optionally increase, the electrical conductivity of the polymer or composite.

The term "ionic liquid" as used herein refers to a liquid salt consisting solely of ions. In certain embodiments, the ionic liquids are room temperature ionic liquids, which melt at or close to room temperature, and typically are salts whose melting point is below 100° C. The term ionic liquid (IL) encompasses liquids having organic cations and anions.

The term "incorporated into" as used herein refers to the ionic liquid being entrained within the composite polymer semiconductor.

The term "under conditions for the solvent-free polymerization" as used herein means any physical or chemical condition in which the polymerization of the phenylacetylene (or derivative thereof) proceeds. In an embodiment, the conditions for the polymerization of the styrene monomer units promote the polymerization reaction. For example, conditions which promote the polymerization of the styrene monomer units include heating the reaction mixture, adding a catalyst to the reaction mixture, exposing the reaction mixture to microwave or ultraviolet energy, stirring the reaction mixture, or allowing the polymerization reaction to proceed for a longer period of time than normal to bring the reaction to, or near, completion.

(II) Polymer Solar Cells

The present disclosure includes polymer solar cells which contain cellulose-polymer composites, and therefore the cellulose portion of the solar cells are biodegradable, or substantially biodegradable. In one embodiment, the cellulose mass fraction of the polymer solar cell is about 99% or less, or about 95% or less, or about 90% or less, or about 80% or less, or about 50% or less. As the methods of preparation of polymeric material for the solar cells generate little or no by-products or waste products, the polymer solar cells of the present disclosure are environmentally friendly, both in their preparation and eventual bio-degradation (of the cellulose component).

The polymer solar cells of the present disclosure comprise an anode and a cathode prepared from an electrically conductive polymer composite (part of the composite is cellulose or cellulose derivative) and a composite polymer semiconductor, and which are fabricated to maximize the interfacial surface area between the anode and cathode. In some embodiments, the anode and the cathode are separated with a thin layer of ionic liquid that dissolves multi-walled carbon nanotubes, or any other carbon-based compound such as fullerenes. Bound electron-hole pairs (excitons) are formed after excitation of a composite polymer semiconductor with light (for example, sunlight). Exciton dissociation then occurs at the interface between a composite polymer semiconductor (donor) and an electrically conductive polymer composite as the charge (for example, an electron) acceptor, resulting in charge transport and current flow. Multi-Walled Carbon Nanotubes, or any other carbon-based compound such as fullerenes, are the acceptors which accept electrons and transfer them to the conductive polymer composites at negative electrode.

In one embodiment, the present disclosure includes a polymeric solar cell comprising
   a. a first electrode comprising:
      a.i. cellulose or a cellulose derivative;
      a.ii. a conductive polymer or conductive polymer composite; and
      a.iii. optionally, a first electrically conductive dopant;
   b. a second electrode comprising:
      b.i. cellulose or a cellulose derivative;
      b.ii. polyphenylacetylene or a derivative thereof, or polystyrene or a derivative thereof wherein the polystyrene is a nano-composite made of polystyrene or its derivatives and metal nanoparticle; and
      b.iii optionally, a second electrically conductive dopant.

In one embodiment, the first and second electrodes are in contact with each other.

In another embodiment, the present disclosure includes a polymer solar cell comprising,
   a. a first electrode (such as a cathode) comprising an electrically conductive polymer composite, wherein the electrically conductive polymer composite comprises:
      a.i. cellulose or a cellulose derivative;
      a.ii. a conductive polymer or conductive polymer composite; and
      a.iii. a first electrically conductive dopant;
   b. a second electrode (such as an anode) comprising a composite polymer semiconductor which comprises:
      b.i. cellulose or a cellulose derivative;
      b.ii. polyphenylacetylene or a derivative thereof, or polystyrene or a derivative thereof wherein the polystyrene is a nano-composite made of polystyrene or its derivatives and metal nanoparticle; and
      b.iii a second electrically conductive dopant.

In some embodiments, the cathode is coated with a layer of ionic liquid that optionally includes carbon-based compounds such as fullerenes, including multi-walled carbon nanotubes. It will be understood by those in the art that a fullerene and a multi-walled carbon nanotube is any molecule made only of carbon in the form of a hollow sphere, ellipsoid or sphere, and which act to absorb light energy and act as an electron donor.

The first electrically conductive dopants include, but are not limited to, iodine ($I_2$), iron trichloride ($FeCl_3$), a metal Naphtalide (such as sodium or lithium), $AgClO_4$, gaseous $O_2$, $H_2O_2$ or benzoquinone (the last three species in aqueous $HBF_4$ and aqueous $HClO_4$), $AsF_5$, metal powder, an ionic liquid and mixtures thereof. Other dopants include dodecylbenzenesulfonic acid (DBSA), indigo carmine, 2,2'-azino-bis(3-ethylbenzothiazoline-6-sulfonate) (ABTS), p-toluenesulfonic acid and its sodium salt (PTSA and PTSA-Na), benzenesulfonic acid (BSA), para-toluene sulphonate. In one embodiment, the dopants do not conduct electricity on their own.

In one embodiment, the first electrode further comprises graphite, or graphite derivatives. In another embodiment, the first electrode further comprises an ionic liquid (optionally as defined below). In another embodiment, the first electrode further comprises a conductive metal (or metal dispersion), wherein a metal powder such as copper, iron and/or aluminum is dispersed in an ionic liquid before polymerization of the conductive polymer (or polymer composite), which results in the distribution of metal particles with diameters larger than a micron within the conductive polymer, and consequently within the anode. In another embodiment, the first electrode optionally includes carbon-based compounds such as fullerenes, including multi-walled carbon nanotubes.

In one embodiment, the electrically conductive polymer composite further comprises graphite, or graphite derivatives. In another embodiment, the electrically conductive polymer composite further comprises an ionic liquid (optionally as defined below). In another embodiment, electrically conductive polymer composite comprises a conductive metal (or metal dispersion), wherein a metal powder such as copper, iron and/or aluminum is dispersed in an ionic liquid before polymerization of the conductive polymer (or polymer composite), which results in the distribution of metal particles with diameters larger than a micron within the conductive polymer, and consequently within the electrically conductive polymer composite. In another embodiment, the electrically conductive polymer composite optionally includes carbon-based compounds such as fullerenes, including multi-walled carbon nanotubes.

In one embodiment, the first electrode comprises between 1-60% (w/w) of cellulose or a cellulose derivative, optionally, between 1-45% (w/w), or about 1-30% (w/w). In another embodiment, the first electrode comprises between 20-80% of the conductive polymer (or polymer composite), optionally between 30-70% (w/w), or 30-60% (w/w). The first electrode also contains a first electrically conductive dopant present at about 1-20% (w/w) or about 1-10% (w/w). Optionally, the first electrode also contains an ionic liquid present between 1-20% (w/w) or about 1-10% (w/w). Optionally, the first electrode also contains graphite present between about 10-50% (w/w), or 20-40% (w/w).

In one embodiment, the electrically conductive polymer composite comprises between 1-60% (w/w) of cellulose or a cellulose derivative, optionally, between 1-45% (w/w), or about 1-30% (w/w). In another embodiment, the electrically conductive polymer composite comprises between 20-80% of the conductive polymer (or polymer composite), optionally between 30-70% (w/w), or 30-60% (w/w). The electrically conductive polymer composite also contains a first electrically conductive dopant present at about 1-20% (w/w) or about 1-10% (w/w). Optionally, the electrically conductive polymer composite also contains an ionic liquid present between 1-20% (w/w) or about 1-10% (w/w). Optionally, the electrically conductive polymer composite also contains graphite present between about 10-50% (w/w), or 20-40% (w/w).

In one embodiment, the ionic liquid is a phosphonium ionic liquid. In one embodiment, the phosphonium ionic liquid has the structure

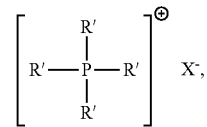

wherein each R' is independently or simultaneously $C_{1-20}$alkyl and X is any suitable anionic ligand. In another embodiment, each R' is independently or simultaneously methyl, ethyl, propyl, butyl, isobutyl, pentyl, hexyl, heptyl, octyl, nonyl, decyl, undecyl, dodecyl, tridecyl, tetradecyl, pentadecyl or hexadecyl.

In another embodiment, X is chloride, bromide, decanoate, (bis 2,4,4-trimethylpentyl)phosphinate, dicyanamide, tosylate, methylsulfate, bistriflamide, hexafluorophosphate, tetrafluoroborate, diethylphosphate or dedecylsulfonate.

In another embodiment, the phosphonium ionic liquid is tetradecyl(trihexyl)phosphonium chloride, tetradecyl(trihexyl)phosphonium bromide, tetradecyl(trihexyl)phosphonium decanoate, tetradecyl(trihexyl)phosphonium(bis 2,4,4-trimethylpentyl)phosphinate, tetradecyl(trihexyl)phosphonium dicyanamide, triisobutyl(methyl)phosphonium tosylate, tributyl(methyl)phosphonium methylsulfate, tetradecyl(trihexyl)phosphonium bistriflamide, tetradecyl(trihexyl)phosphonium hexafluorophosphate, tetradecyl(trihexyl)phosphonium tetrafluoroborate, tributyl(hexadecyl)phosphonium bromide, tetrabutylphosphonium bromide, tetrabutylphosphonium chloride, tetraoctylphosphonium bromide, tetradecyl(tributyl)phosphonium chloride, ethyltri(butyl)phosphonium diethylphosphate, tetradecyl(tributyl)phosphonium dodecylsulfonate or tetradecyl(trihexyl)phosphonium dodecylsulfonate.

In another embodiment, the phosphonium ionic liquid is selected from

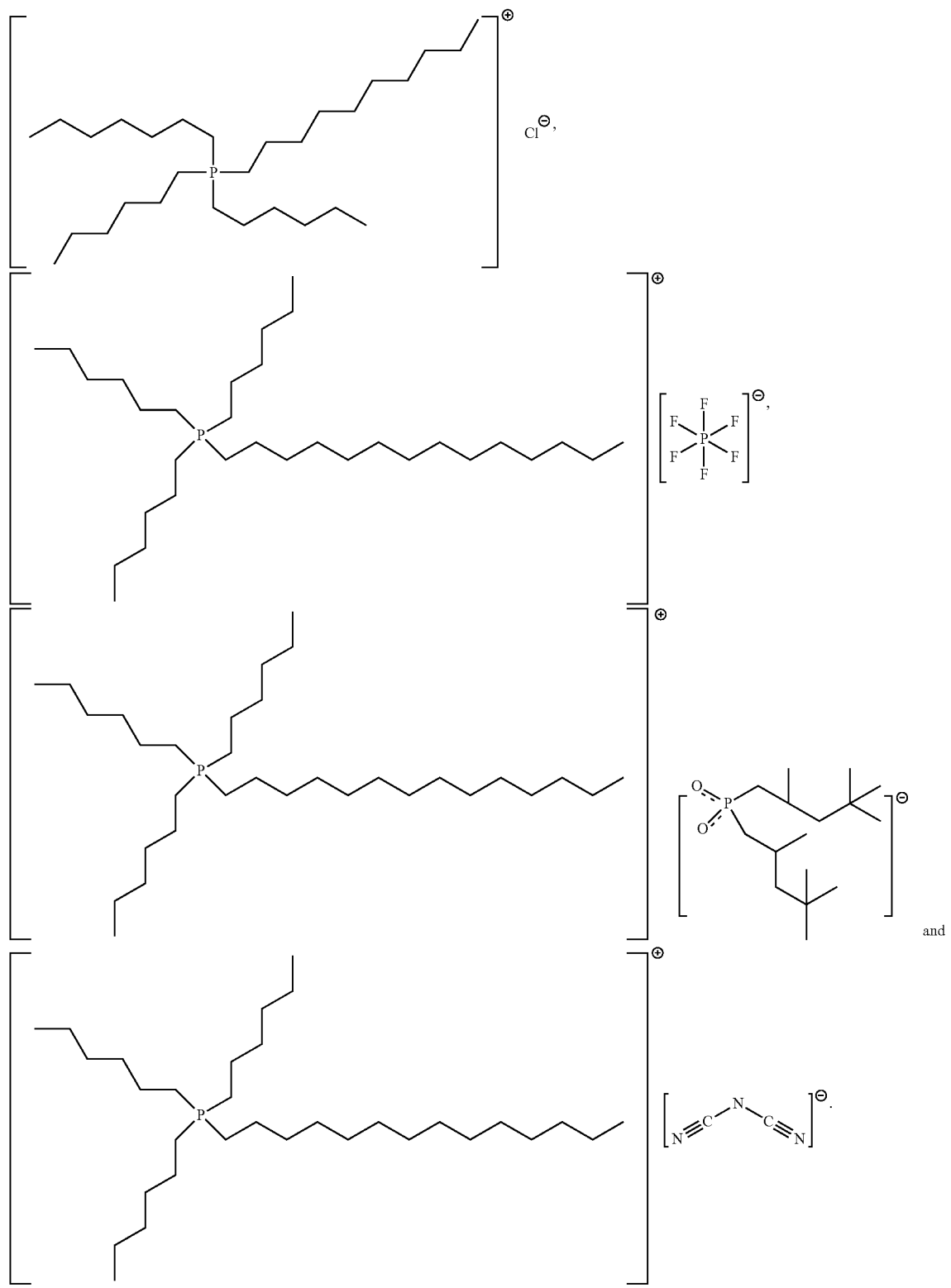

In one embodiment, the conductive polymer is polyaniline, poly(p-phenylene-vinylene), poly(thiophene), poly(fluorene), polyphenylene, polypyrene, polyazulene, polynaphthalene, polycarbazole, polyindole, poly(p-phenylene sulfide), derivatives or copolymers thereof.

In another embodiment, the conductive polymer comprises an optionally substituted 5- or 6-membered heteroaromatic ring, wherein the optional substituents are selected independently or simultaneously from one, two or three of halo, $(C_{1-6})$-alkyl, or fluoro-substituted $(C_{1-6})$-alkyl. The heteroaromatic polymer is of the formula (III)

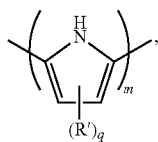

wherein R' is independently or simultaneously halo, (C1-6)-alkyl, or fluoro-substituted ($C_{1-6}$)-alkyl, q is 0, 1 or 2; and m is an integer greater than or equal to 100.

In another embodiment, the polymer of the formula (III) is

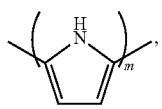

wherein m is an integer which is greater than or equal to 100.

In an embodiment of the disclosure, the second electrode contains between 30-95% (w/w) of cellulose or a cellulose derivative, optionally 40-90% (w/w) or about 50-90% (w/w). In another embodiment, the polyphenylacetylene or derivative thereof, or metal polystyrene nanoparticle or derivative thereof in the cathode is present at about 1-50 (w/w), or about 5-45% (w/w) or about 5-40% (w/w). The second electrically conductive dopant in the second electrode is present at about 1-20% (w/w), or about 1-10% (w/w) or 5-10% (w/w).

In an embodiment of the disclosure, the composite polymer semiconductor contains between 30-95% (w/w) of cellulose or a cellulose derivative, optionally 40-90% (w/w) or about 50-90% (w/w). In another embodiment, the polyphenylacetylene or derivative thereof, or metal polystyrene nanoparticle or derivative thereof in the composite polymer semiconductor is present at about 1-50 (w/w), or about 5-45% (w/w) or about 5-40% (w/w). The second electrically conductive dopant in the composite polymer semiconductor is present at about 1-20% (w/w), or about 1-10% (w/w) or 5-10% (w/w).

In another embodiment of the disclosure, the polystyrene or derivative thereof (of the metal nanoparticle) is of the formula (IV):

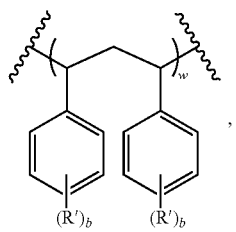

wherein R' is independently or simultaneously halo or ($C_{1-6}$)-alkyl, the latter group being optionally substituted by halo, ($C_{1-2}$)-alkyl or fluoro-substituted ($C_{1-2}$)-alkyl;
b is 0, 1, 2, 3 4, or 5;
w is an integer between 100 to 200,000, or optionally between 100 to 100,000;
and the polyphenylacetylene or polyphenylacetylene derivative of the semiconductive polymer composite is of the formula (V):

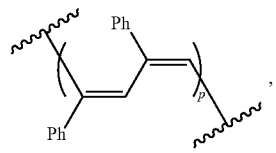

wherein Ph is optionally substituted phenyl,
the optional substituents are simultaneously or independently selected from one to five of halo, optionally substituted ($C_{1-6}$)-alkyl, optionally substituted ($C_{1-6}$)-alkoxy, optionally substituted ($C_{6-14}$)-aryl, optionally substituted ($C_{5-14}$)-heteroaryl, nitro, and —$NR^1R^2$ wherein $R^1$ and $R^2$ are independently or simultaneously H, ($C_{1-6}$)-alkyl or ($C_{6-14}$)-aryl, and
p is an integer between 100 to 50,000.

In another embodiment, the polystyrene, polyphenylacetylene or derivative thereof is

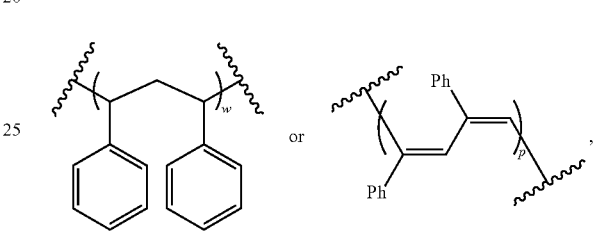

wherein Ph is unsubstituted phenyl,
w is an integer between 100 to 100,000, and
p is an integer between 100 to 50,000.

In one embodiment, the polystyrene or derivative thereof may be in the form of metal polystyrene nanoparticles which comprise a metal nanoparticle core surrounded by the polystyrene polymer. The nanoparticles have average dimensions or diameters less than 1000 nm, optionally less than 500 nm, or optionally less than 100 nm. The core of the metal nanoparticle refers to the inner metal portion of the metal polystyrene nanoparticles, wherein core is encapsulated by polystyrene or a polystyrene derivative as defined above, in which encapsulated refers to the metal core being embedded, coated, or otherwise sealed within the polystyrene or a polystyrene derivative.

In one embodiment, the trans-isomer of polyphenylacetylene has a higher electrical conductivity than the cis-isomer.

The second electrically conductive dopants include, but are not limited to, iodine ($I_2$), iron trichloride ($FeCl_3$), a metal Naphtalide (such as sodium or lithium), $AgClO_4$, gaseous $O_2$, $H_2O_2$ or benzoquinone (the last three species in aqueous $HBF_4$ and aqueous $HClO_4$), $AsF_5$, metal powder, an ionic liquid and mixtures thereof. Other dopants include dodecylbenzenesulfonic acid (DBSA), indigo carmine, 2,2'-azino-bis(3-ethylbenzothiazoline-6-sulfonate) (ABTS), p-toluenesulfonic acid and its sodium salt (PTSA and PTSA-Na), benzenesulfonic acid (BSA), para-toluene sulphonate. In one embodiment, the dopants do not conduct electricity on their own.

In one embodiment, the second electrode further comprises graphite or derivative thereof, a fullerene such as a multi-walled carbon nanotubes or derivatives thereof embedded in the polymer. It will be understood by those in the art that a Multi-Walled Carbon Nanotubes is any molecule made only of carbon in the form of a hollow sphere, elliposoid or sphere, and absorb light energy and act as an electron donor. In another embodiment, the second electrode further comprises an ionic liquid (optionally as defined above). In another embodiment, the second electrode comprises a conductive metal (or metal dispersion), wherein a metal powder such as copper, iron and/or aluminum is dispersed in an ionic liquid before polymerization of the conductive polymer (or polymer composite), which results in the distribution of metal particles with diameters larger than a micron within the conductive polymer, and consequently within the first electrode or electrically conductive polymer composite.

In one embodiment, the composite polymer semiconductor further comprises graphite or derivative thereof, a fullerene such as a multi-walled carbon nanotubes or derivatives thereof embedded in the polymer. It will be understood by those in the art that a Multi-Walled Carbon Nanotubes is any molecule made only of carbon in the form of a hollow sphere, elliposoid or sphere, and absorb light energy and act as an electron donor. In another embodiment, the composite polymer semiconductor further comprises an ionic liquid (optionally as defined above). In another embodiment, the composite polymer semiconductor comprises a conductive metal (or metal dispersion), wherein a metal powder such as copper, iron and/or aluminum is dispersed in an ionic liquid before polymerization of the conductive polymer (or polymer composite), which results in the distribution of metal particles with diameters larger than a micron within the conductive polymer, and consequently within the electrically conductive polymer composite.

The polymer solar cells of the present disclosure may further comprise a substrate upon which the solar cell is supported. Examples of substrates include paper or paper derivatives, polycarbonate or glass. In addition, the polymer solar cells may also comprise a film over the solar cell to protect the composites during use.

In one embodiment, the electrical conductivity of the polymer solar cells of the present disclosure are tuned by adjusting the amounts of polymer within the cellulose, as well as adjusting the amount of ionic liquids, fullerenes (such as Multi-Walled Carbon Nanotubes) or electrically conductive dopants within the polymer to achieve the electrical conductivity desired. In addition, manipulating the process conditions when preparing the composites also results in the ability to tune the electrical conductivity to the desired level. For example, in one embodiment, the thickness of the composite polymer semiconductor is adjusted to manipulate the electron conductivity of the polymer solar cell. For example, the composite polymer semiconductor have an electron conductivity of between $10^{-10}$ and 10.0 S/cm, or optionally between 0.0001 and 1.0 S/cm, or between 0.01 and 1.0 S/cm.

In another embodiment, the electrically conductive polymer composite (the first electrode) has a surface resistivity of less than 10 Ohm/Sq, for example between 0.0001 and 10 Ohm/Sq, optionally, 0.01 and 10 Ohm/Sq, or about 0.1 to 1.0 Ohm/Sq. In another embodiment, the composite polymer semiconductor (the second electrode) has a surface resistivity of between 10 Ohm/Sq and $10^8$ Ohm/Sq, optionally 10 Ohm/Sq and $10^6$ Ohm/Sq, or between 10 and 10000 Ohm/Sq, optionally 10 and 500 Ohm/Sq, or about 10 and 100 Ohm/Sq.

FIG. 1 shows a schematic representation of a polymer solar cell (10) of the present disclosure. A substrate (12) forms a support for the second electrode (14) and first electrode (16) of the solar cell. A protective film (18) may also be used to protect the electrode architecture.

The polymer composites of the anode and cathode have variety of applications including in solar cells, fuel cells, batteries, supercapacitors, ESI etc.

In another embodiment of the disclosure, there is also included a polymer solar cell comprising,
 a. a first electrode comprising an electrically conductive polymer composite, wherein the electrically conductive polymer composite comprises:
  a.i. cellulose or a cellulose derivative;
  a.ii. a conductive polymer or conductive polymer composite; and
  a.iii. a first electrically conductive dopant;
 b. a second electrode comprising a composite polymer semiconductor which comprises:
  b.i. cellulose or a cellulose derivative;
  b.ii. polyphenylacetylene or a derivative thereof; and
  b.iii. optionally, a second electrically conductive dopant.

In one embodiment, the first and second electrodes are in contact with each other. It will be understood that all of the components of this solar cell are as defined above.

(I.B) Methods of Manufacture of the Polymer Solar Cell

The present disclosure also includes methods of manufacturing the polymer solar cells as disclosed above. In particular, the disclosure includes processes for the preparation of the first and second electrodes (the electrically conductive polymer composite and the composite polymer semi-conductor), as well as methods for fabricating the solar cell on a substrate. In some embodiments, the processes for the preparation of the polymer composites are conducted as solvent-free processes, which consequently generate few, if any, by-products.

In one embodiment, the first electrode comprising the electrically conductive polymer composite is prepared by the in situ polymerization of monomeric units of the organic conductive polymer in the presence of cellulose fibers, which generates the polymer composite. A person skilled in the art would readily identify the monomeric units of the particular conductive polymer. For example, when the conductive polymer comprises optionally substituted polypyrrole, the monomeric unit used to prepare the polymer is optionally substituted pyrrole. Likewise, for example, when the conductive polymer comprises optionally substituted polythiophene, the monomeric units used to prepare the polymer is optionally substituted thiophene. In one embodiment, the polymerization is done via chemical oxidation method with free radical cations as intermediates.

The preparation of the conductive polymer in the presence of cellulose may also occur in the presence of an electrically conductive dopant, an ionic liquid, a carbon-based compound such as fullerenes including multi-walled carbon nanotubes or derivatives thereof embedded in the polymer. Examples of an electrically conductive dopant include, but are not limited to, iodine ($I_2$), iron trichloride ($FeCl_3$), a metal Naphtalide (such as sodium or lithium), $AgClO_4$, gaseous $O_2$, $H_2O_2$ or benzoquinone (the last three species in aqueous $HBF_4$ and aqueous $HClO_4$), $AsF_5$, metal powder, and mixtures thereof. Other dopants include dodecylbenzenesulfonic acid (DBSA), indigo carmine, 2,2'-azino-bis(3-ethylbenzothiazoline-6-sulfonate) (ABTS), p-toluenesulfonic acid, and its sodium salt (PTSA and PTSA-Na), benzenesulfonic acid (BSA), para-toluene sulphonate. The ionic liquid, carbon-based compound such as fullerenes including multi-walled carbon nanotubes or derivatives thereof, or other conductive dopant, becomes entrained within the polymer composite, and so does not contribute to any waste product.

In one embodiment, the polymerization process to prepare the conductive polymer is done via chemical oxidation method with free radical cations as intermediates. For example, monomer units of the conductive polymer are added to an aqueous solution of a conductive dopant (such as $FeCl_3$), and the polymerization reaction is carried out at room temperature.

In one embodiment, the second electrode comprising the composite polymer semiconductor is prepared by polymerization of monomeric units of styrene (including metal nanoparticles as defined above), phenylacetylene, or derivatives thereof, (either in the presence or absence of cellulose fibers and an ionic liquid), which generates the polymer composite.

The solvent-free in situ preparation of the polystyrene or polystyrene or a derivative thereof (wherein the polystyrene is a nano-composite made of polystyrene or its derivatives and metal nanoparticle), polyphenylacetylene or derivatives thereof, in the presence of cellulose and an ionic liquid, may also occur in the presence of an electrically conductive dopant, an ionic liquid, carbon-based compound such as fullerenes including multi-walled carbon nanotubes or derivatives thereof (embedded in the polymer), or any other conductive dopant. Examples of a conductive dopant include, but are not limited to, iodine ($I_2$), iron trichloride ($FeCl_3$), a metal Naphtalide (such as sodium or lithium), $AgClO_4$, gaseous $O_2$, $H_2O_2$ or benzoquinone (the last three species in aqueous $HBF_4$ and aqueous $HClO_4$), $AsF_5$, metal powder, and mixtures thereof. Other dopants include dodecylbenzenesulfonic acid (DBSA), indigo carmine, 2,2'-azino-bis(3-ethylbenzothiazoline-6-sulfonate) (ABTS), p-toluenesulfonic acid, and its sodium salt (PTSA and PTSA-Na), benzenesulfonic acid (BSA), para-toluene sulphonate. The ionic liquid or other conductive dopant becomes entrained within the polymer composite, and so does not contribute to any waste product.

In one embodiment, the cellulose or cellulose derivative is dissolved in an ionic liquid (such as a phosphonium ionic liquid), optionally with a co-solvent such as dimethyl formamide (DMF), followed by the polymerization of the monomers in the ionic liquid (optionally with the co-solvent) containing the cellulose. The addition of a co-solvent, such as DMF, increases the speed of dissolution of the cellulose in the liquid, and also decreases the viscosity of the ionic liquid which increases the speed of polymerization.

The polymerization process to prepare the composite polymer semiconductor may also be conducted in the presence of a free radical initiator, such as 2,2'-azobis(2,4-dimethylvaleronitrile) (AVBN), azobisisobutyronitrile (AIBN) or hydrogen peroxide. The free radical initiators are used in relatively minor amounts ranging from 0.1 to 1% to initiate the free radical reaction, which are also entrained within the polymer composite upon polymerization.

In another embodiment, the process for preparing the composite polymer semiconductor may also be carried out by polymerizing the styrene (in the presence of metal nanoparticles and optionally ionic liquid) or derivative thereof, phenylacetylene, or derivative thereof, in the presence or absence of an ionic liquid, and after polymerization has occurred, coating the polymer entrained with the ionic liquid onto cellulose fibers. For example, polystyrene, polyphenylacetylene, or a derivative thereof, entrained with an ionic liquid, is coated on a cellulosic substrate, such as paper, forming the composite as the cathode.

Once the electrically conductive polymer composite (first electrode) and the composite polymer semiconductor (second electrode) have been prepared, the architecture of the polymer solar cell is generated. One manner of generating polymer solar cell architectures is by printing the first electrode (for example, the anode) (the electrically conductive polymer composite) on the second electrode (for example, the cathode) with a film of ionic liquid on the second electrode (the composite polymer semiconductor). For example, in one embodiment, the second electrode is formulated into a paper-like material which is then subjected to ink-jet printing wherein the first electrode is printed on the second electrode. In this manner, any two-dimensional architecture is achieved for the polymer solar cell. Each material for components described earlier has a specific task towards the overall objective of harvesting solar light and transforming it into electricity. The electrically conductive polymer composite which optionally includes ionic liquid works as both the first electrode and serves as well as a solid electrolyte. The fabrication is depicted in FIG. 1. In another manner the first electrode (the conductive polymer composite) is separated from the second electrode (semiconductor paper composite) by a film of ionic liquid which serves as electrolyte.

(II) Process for Dissolving Cellulose or Cellulose Derivative in an Ionic Liquid to Obtain a Cellulose Composite The present disclosure also includes a process for the preparation of the electrically conductive polymer composite and the composite polymer semiconductor.

In an embodiment of the disclosure, there is included a process for dissolving cellulose or a cellulose derivative in a phosphonium ionic liquid comprising
(i) mixing the cellulose or cellulose derivative with the ionic liquid under conditions for the dissolution of the cellulose or cellulose derivative in the ionic liquid, and
(ii) obtaining a cellulose composite comprising the cellulose or cellulose derivative incorporated with the ionic liquid.

In another embodiment, the ionic liquid is further mixed with a co-solvent, such as alcohols (such as methanol), water, DMSO, $CH_3CN$ dimethyl formamide (DMF), wherein the cellulose composite is also incorporated with the co-solvent. The addition of a co-solvent, such as DMF, increases the speed of dissolution of the cellulose in the liquid, and also decreases the viscosity of the ionic liquid which increases the speed of polymerization. In one embodiment, the co-solvent is DMF.

In one embodiment, the cellulose or cellulose derivative is mixed with the ionic liquid at a temperature between 50° C. and 100° C., or between 60° C. and 85° C., or about 70° C.

In one embodiment, the cellulose or cellulose derivative is mixed with the ionic liquid for a time between 3-6 hours, optionally about 4 hours.

In one embodiment, the ionic liquid is a phosphonium ionic liquid, for example having the structure

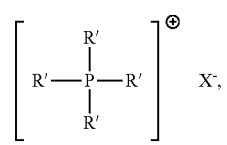

wherein
each R' is independently or simultaneously $C_{1-20}$alkyl and X is any suitable anionic ligand.

In one embodiment, the phosphonium ionic liquid is tetradecyl(trihexyl)phosphonium chloride, tetradecyl(trihexyl)phosphonium bromide, tetradecyl(trihexyl)phosphonium decanoate, tetradecyl(trihexyl)phosphonium(bis 2,4,4-trimethylpentyl)phosphinate, tetradecyl(trihexyl) phosphonium dicyanamide, triisobutyl(methyl) phosphonium tosylate, tributyl(methyl)phosphonium methylsulfate, tetradecyl(trihexyl)phosphonium bistriflamide, tetradecyl(trihexyl)phosphonium hexafluorophosphate, tetradecyl(trihexyl)phosphonium tetrafluoroborate, tributyl(hexadecyl)phosphonium bromide, tetrabutylphosphonium bromide, tetrabutylphosphonium chloride, tetraoctylphosphonium bromide, tetradecyl(tributyl)phosphonium chloride, ethyltri(butyl)phosphonium diethylphosphate, tetradecyl(tributyl)phosphonium dodecylsulfonate or tetradecyl(trihexyl)phosphonium dodecylsulfonate.

In another embodiment, the phosphonium ionic liquid is selected from

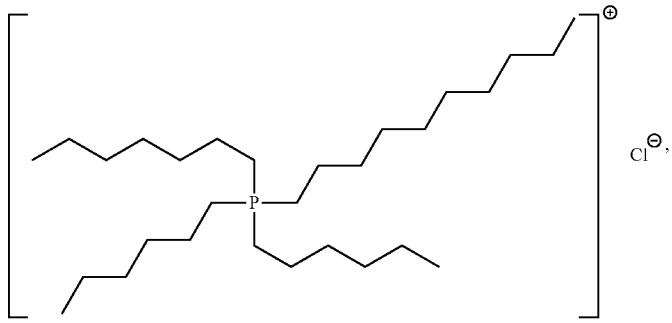

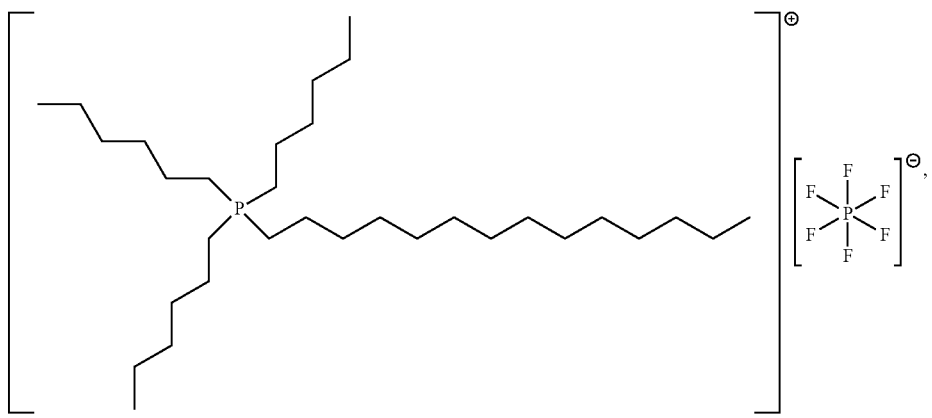

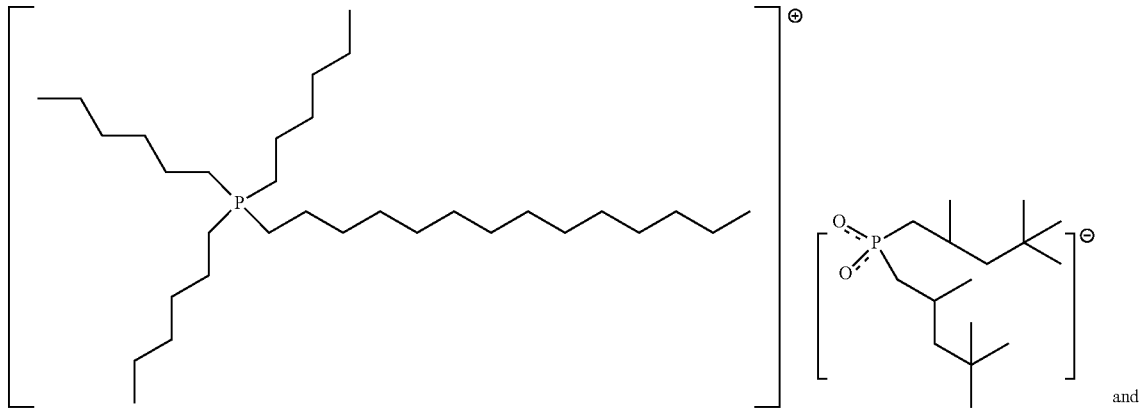

and

-continued

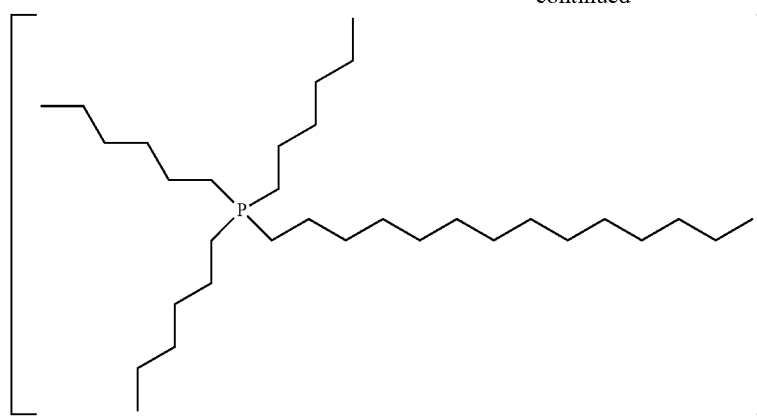 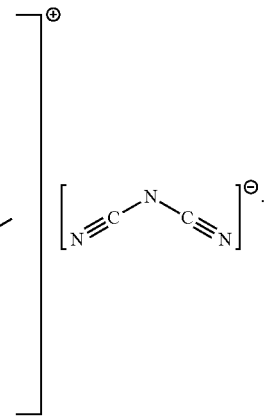

In another embodiment, the cellulose composite is further mixed with an initiator such as ferric chloride, ammonium persulphate, potassium persulphate, Iodine, hydrogen peroxide, all other peroxides, AIBN, ABVN and all Azo compounds. Subsequently, a monomer of phenylacetylene (or derivative thereof), styrene (or derivative thereof), or other monomer (to form an electrically conductive polymer), and polymerizing in situ to obtain the electrically conductive polymer composite or the composite polymer semiconductor. In one embodiment, the other monomer forms an electrically conductive polymer such as polyaniline, poly(p-phenylene-vinylene), poly(thiophene), poly(fluorene), polyphenylene, polypyrene, polyazulene, polynaphthalene, polycarbazole, polyindole, poly(p-phenylene sulfide), derivatives or copolymers thereof. A person skilled in the art would readily understand the monomers needed to form a polymer, such as polyaniline from the monomer aniline. In one embodiment, the monomer is pyrrole, indole, anilines, thiophene, 3,4-ethylenedioxythiophene, phenylacetylene, stryene, or derivatives, co-polymers, or mixtures thereof. In one embodiment, the in situ polymerization is maintained at 40° C. or lower.

The conductive polymer cellulose composite is then obtained by washing the composite with an organic solvent such as ethanol, acetone, or liquid/supercritical fluids and co-solvents. In one embodiment, the conductive polymer cellulose composite has a surface resistivity gradient, in which the gradient can be modified based on the selection of the components.

In one embodiment, the conductive polymer cellulose composite is regenerated from solution by using organic solvent such as ethanol, acetone, or liquid/supercritical fluids and co-solvents, wherein upon contact with the organic solvent, the cellulose composite material is re-formed into a solid (strands, sheets) from its dissolved state in solution.

In another embodiment of the disclosure, there is include a paper based flexible display comprising:
a base layer paper substrate;
a second layer of a grid made of conductive polymer cellulose composites; and
a third layer of dye based on electricity-sensitive compound that change colours under small current, can be used to dye or printed on the paper.

(III) Process for Preparation of Polyphenylacetylene and its Derivatives

The present disclosure also includes a process for the preparation of polyphenylacetylene or derivative thereof, which, in some embodiments, is utilized to prepare the composite polymer semiconductor. The polymerization of phenylacetylene or derivative thereof is conducted as a solvent-free process, resulting in few, if any, waste products, and as such, the process is environmentally friendly.

In one embodiment therefore, the present disclosure includes a process for the solvent-free preparation of polyphenylacetylene polymer or a derivative thereof, comprising polymerizing phenylacetylene or a phenylacetylene derivative in the presence of a free radical initiator, under conditions for the solvent-free polymerization of the phenylacetylene or phenylacetylene derivative, wherein the polyphenylacetylene or derivative thereof is prepared in greater than 70% yield, optionally, 80% yield, or 90% yield, or 95% yield, or 98% yield, or 99% yield, in which the reaction time is less than 4 hours, or less than 3 hours, or less than 2 hours, or less than 1 hour, or less than 30 minutes, or less than 15 minutes.

In one embodiment, the phenylacetylene or a phenylacetylene derivative is a compound of the formula (I):

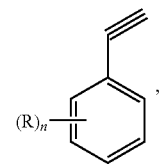

wherein
R is simultaneously or independently halo, optionally substituted $(C_{1-6})$-alkyl, optionally substituted $(C_{1-6})$-alkoxy, optionally substituted $(C_{6-14})$-aryl, optionally substituted $(C_{5-14})$-heteroaryl, nitro, or —$NR^1R^2$ wherein $R^1$ and $R^2$ are independently or simultaneously H, $(C_{1-6})$-alkyl or $(C_{6-14})$-aryl,
the optional substituents are halo, $(C_{1-2})$-alkyl or fluoro-substituted $(C_{1-2})$-alkyl, and
n is 0, 1, 2, 3, 4, or 5.

In one embodiment, n is 0, 1 or 2, or optionally 0.

The process for the polymerization of phenylacetylene or derivative thereof is conducted in the presence of a free radical initiator such as 2,2'-azobis(2,4-dimethylvaleronitrile) (AVBN), or hydrogen peroxide. It will be understood that any free radical initiator could be used which generates free radicals to start the polymerization process. It will also be understood that the free radical initiator becomes entrained within the polymer that is formed, and does not become a waste product other than the released gas (e.g. nitrogen or oxygen).

In another embodiment of the disclosure, the process is conducted in the presence of a catalyst, such as a transition metal catalyst, for example tungsten hexachloride. It will be understood that any catalyst can be used which catalyzes the polymerization of the phenylacetylene or derivative thereof.

In some embodiments, the polymerization process is carried out in the presence of a conductive dopant, which alters, or increases, the electrical conductivity of the polyphenylacetylene or derivative thereof. For example, the conductive dopant is iodine ($I_2$), iron trichloride ($FeCl_3$), a metal napthalide, $AgClO_4$, gaseous $O_2$, $H_2O_2$ or benzoquinone (the last three species in aqueous $HBF_4$ and aqueous $HClO_4$), $AsF_5$ an ionic liquid and combination of above, graphite, Multi-Walled Carbon Nanotubes or Multi-Walled Carbon Nanotubes derivatives embedded in the polymer. Other dopants include dodecylbenzenesulfonic acid (DBSA), indigo carmine, 2,2'-azino-bis(3-ethylbenzothiazoline-6-sulfonate) (ABTS), p-toluenesulfonic acid, and its sodium salt (PTSA and PTSA-Na), benzenesulfonic acid (BSA), para-toluene sulphonate.

In another embodiment, the conductive dopant is an ionic liquid, such as a phosphonium ionic liquid. In another embodiment, the phosphonium ionic liquid has the structure

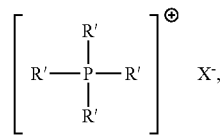

wherein each R' is independently or simultaneously $C_{1-20}$alkyl and X is any suitable anionic ligand. In another embodiment, each R' is independently or simultaneously methyl, ethyl, propyl, butyl, isobutyl, pentyl, hexyl, heptyl, octyl, nonyl, decyl, undecyl, dodecyl, tridecyl, tetradecyl, pentadecyl or hexadecyl.

In another embodiment, X is chloride, bromide, decanoate, (bis 2,4,4-trimethylpentyl)phosphinate, dicyanamide, tosylate, methylsulfate, bistriflamide, hexafluorophosphate, tetrafluoroborate, diethylphosphate or dedecylsulfonate.

In another embodiment, the phosphonium ionic liquid is tetradecyl(trihexyl)phosphonium chloride, tetradecyl(trihexyl)phosphonium bromide, tetradecyl(trihexyl)phosphonium decanoate, tetradecyl(trihexyl)phosphonium(bis 2,4,4-trimethylpentyl)phosphinate, tetradecyl(trihexyl) phosphonium dicyanamide, triisobutyl(methyl) phosphonium tosylate, tributyl(methyl)phosphonium methylsulfate, tetradecyl(trihexyl)phosphonium bistriflamide, tetradecyl(trihexyl)phosphonium hexafluorophosphate, tetradecyl(trihexyl)phosphonium tetrafluoroborate, tributyl(hexadecyl)phosphonium bromide, tetrabutylphosphonium bromide, tetrabutylphosphonium chloride, tetraoctylphosphonium bromide, tetradecyl(tributyl)phosphonium chloride, ethyltri(butyl)phosphonium diethylphosphate, tetradecyl(tributyl)phosphonium dodecylsulfonate or tetradecyl(trihexyl)phosphonium dodecylsulfonate.

In another embodiment, the phosphonium ionic liquid is selected from

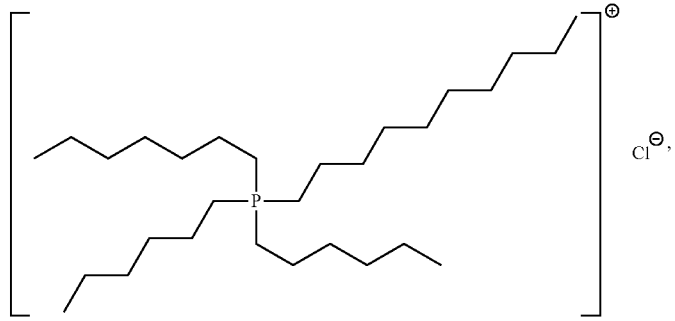

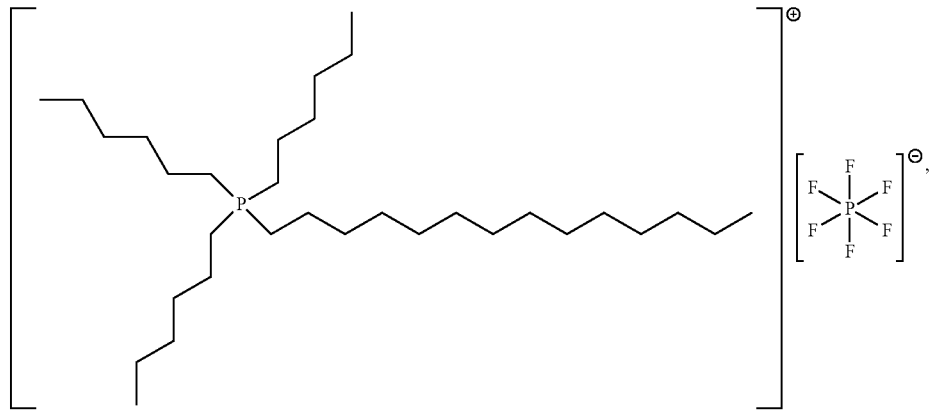

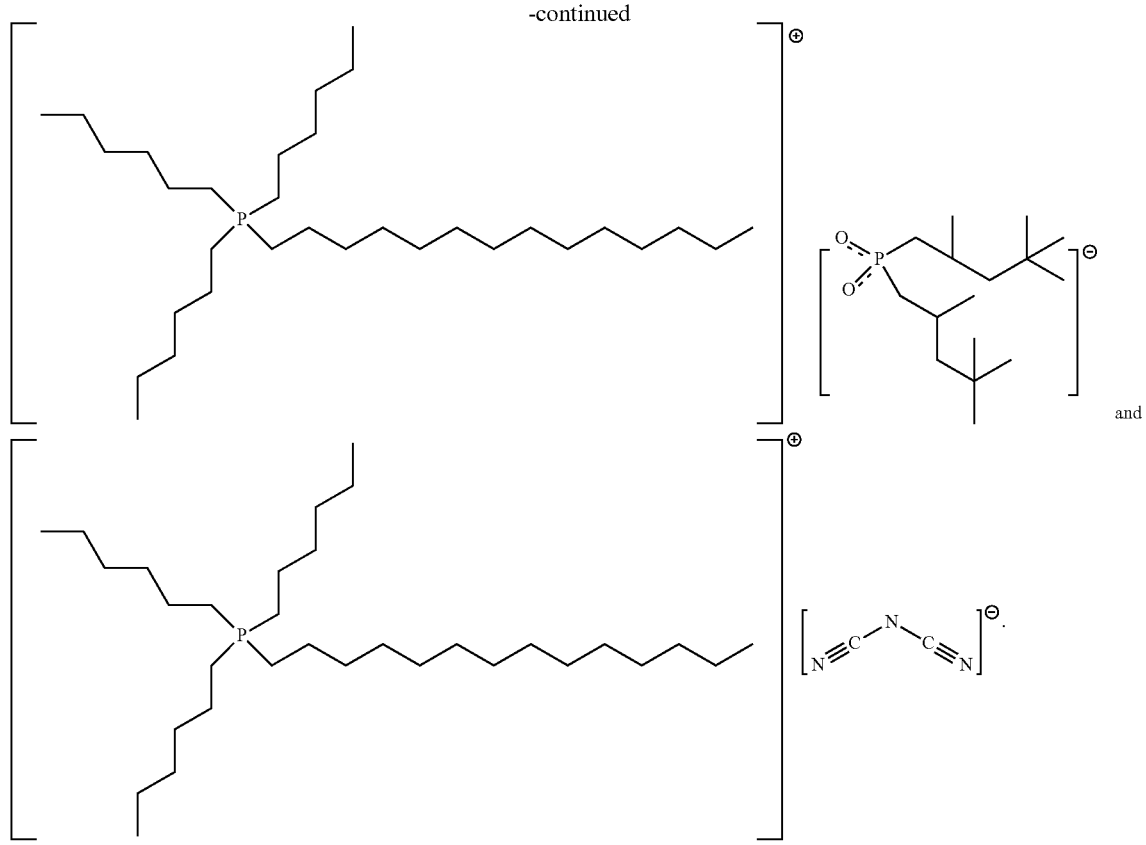

and

The process for polymerizing phenylacetylene or a derivative thereof, generally results in the trans-isomer as the dominant isomer. For example, at least 50%, or about 60%, or about 70%, or about 80%, or about 90%, or about 95%, or about 99%, of the polymer is generated as the trans-isomer. In one embodiment, the the polyphenylacetylene or a polyphenylacetylene derivative is of the formula (II)

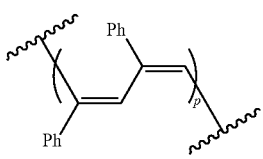

wherein

Ph is optionally substituted phenyl, the optional substituents are simultaneously or independently selected from one to five of halo, optionally substituted $(C_{1-6})$-alkyl, optionally substituted $(C_{1-6})$-alkoxy, optionally substituted $(C_{6-14})$-aryl, optionally substituted $(C_{5-14})$-heteroaryl, nitro, or —$NR^1R^2$ wherein $R^1$ and $R^2$ are independently or simultaneously H, $(C_{1-6})$-alkyl or $(C_{6-14})$-aryl p is an integer between 100 to 50,000.

In one embodiment, Ph is unsubstituted phenyl.

The composite polymers are useful as materials for low temperature fuel cell membranes and processes to make them.

(IV) Polyphenylacetlyene Semiconductor Composite

The present disclosure also includes semiconductor polymer composites based on polyphenylacetylene or a derivative thereof, and cellulose or a cellulose derivative. The composites are substantially biodegradable due to the presence of cellulose or cellulose derivative, lightweight and flexible. In one embodiment, the cellulose mass fraction of the polymer solar cell is about 99% or less, or about 95% or less, or about 90% or less, or about 80% or less, or about 50% or less.

In one embodiment therefore, the present disclosure includes a semiconductor polymer composite, comprising:
 a) cellulose or a cellulose derivative;
 b) polyphenylacetylene or a polyphenylacetylene derivative; and
 c) an electrically conductive dopant such as iodine ($I_2$), iron trichloride ($FeCl_3$), a metal napthalide, $AgClO_4$, gaseous $O_2$, $H_2O_2$ or benzoquinone (the last three species in aqueous $HBF_4$ and aqueous $HClO_4$), $AsF_5$, an ionic liquid and combination of above, graphite, Multi-Walled Carbon Nanotubes or Multi-Walled Carbon Nanotubes derivatives. Other dopants include dodecylbenzenesulfonic acid (DBSA), indigo carmine, 2,2'-azino-bis(3-ethylbenzothiazoline-6-sulfonate) (ABTS), p-toluenesulfonic acid, and its sodium salt (PTSA and PTSA-Na), benzenesulfonic acid (BSA), para-toluene sulphonate.

In one embodiment, the polyphenylacetylene or a polyphenylacetylene derivative is prepared as described above as a solvent-free preparation, in the presence of cellulose or a cellulose derivative to prepare the semiconductor polymer composite.

In one embodiment, the polyphenylacetylene or polyphenylacetylene derivative is of the formula (II):

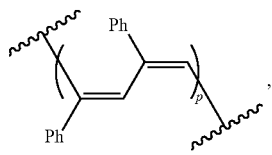

wherein Ph is optionally substituted phenyl,
the optional substituents are simultaneously or independently selected from one to five of halo, optionally substituted $(C_{1-6})$-alkyl, optionally substituted $(C_{1-6})$-alkoxy, optionally substituted $(C_{6-14})$-aryl, optionally substituted $(C_{5-14})$-heteroaryl, nitro, and $-NR^1R^2$ wherein $R^1$ and $R^2$ are independently or simultaneously H, $(C_{1-6})$-alkyl or $(C_{6-14})$-aryl, and
p is an integer between 100 to 50,000.

In one embodiment, Ph is unsubstituted phenyl.

In some embodiments, the composite polymer semiconductor further comprises a conductive dopant, which alters, or increases, the electrical conductivity of the polyphenylacetylene or derivative thereof. For example, the conductive dopant is iodine ($I_2$), iron trichloride ($FeCl_3$), a metal napthalide, $AgClO_4$, gaseous $O_2$, $H_2O_2$ or benzoquinone (the last three species in aqueous $HBF_4$ and aqueous $HClO_4$), $AsF_5$ an ionic liquid and combination of above, Multi-Walled Carbon Nanotubes or Multi-Walled Carbon Nanotubes derivatives embedded in the polymer. Other dopants include dodecylbenzenesulfonic acid (DBSA), indigo carmine, 2,2'-azino-bis(3-ethylbenzothiazoline-6-sulfonate) (ABTS), p-toluenesulfonic acid, and its sodium salt (PTSA and PTSA-Na), benzenesulfonic acid (BSA), para-toluene sulphonate.

In another embodiment, the conductive dopant is an ionic liquid, such as a phosphonium ionic liquid. In another embodiment, the phosphonium ionic liquid has the structure

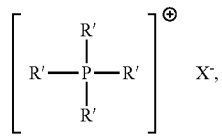

wherein
each R' is independently or simultaneously $C_{1-20}$alkyl and X is any suitable anionic ligand. In another embodiment, each R' is independently or simultaneously methyl, ethyl, propyl, butyl, isobutyl, pentyl, hexyl, heptyl, octyl, nonyl, decyl, undecyl, dodecyl, tridecyl, tetradecyl, pentadecyl or hexadecyl.

In another embodiment, X is chloride, bromide, decanoate, (bis 2,4,4-trimethylpentyl)phosphinate, dicyanamide, tosylate, methylsulfate, bistriflamide, hexafluorophosphate, tetrafluoroborate, diethylphosphate or dedecylsulfonate.

In another embodiment, the phosphonium ionic liquid is tetradecyl(trihexyl)phosphonium chloride, tetradecyl(trihexyl)phosphonium bromide, tetradecyl(trihexyl)phosphonium decanoate, tetradecyl(trihexyl)phosphonium(bis 2,4,4-trimethylpentyl)phosphinate, tetradecyl(trihexyl) phosphonium dicyanamide, triisobutyl(methyl) phosphonium tosylate, tributyl(methyl)phosphonium methylsulfate, tetradecyl(trihexyl)phosphonium bistriflamide, tetradecyl(trihexyl)phosphonium hexafluorophosphate, tetradecyl(trihexyl)phosphonium tetrafluoroborate, tributyl(hexadecyl)phosphonium bromide, tetrabutylphosphonium bromide, tetrabutylphosphonium chloride, tetraoctylphosphonium bromide, tetradecyl(tributyl)phosphonium chloride, ethyltri(butyl)phosphonium diethylphosphate, tetradecyl(tributyl)phosphonium dodecylsulfonate or tetradecyl(trihexyl)phosphonium dodecylsulfonate.

In another embodiment, the phosphonium ionic liquid is selected from

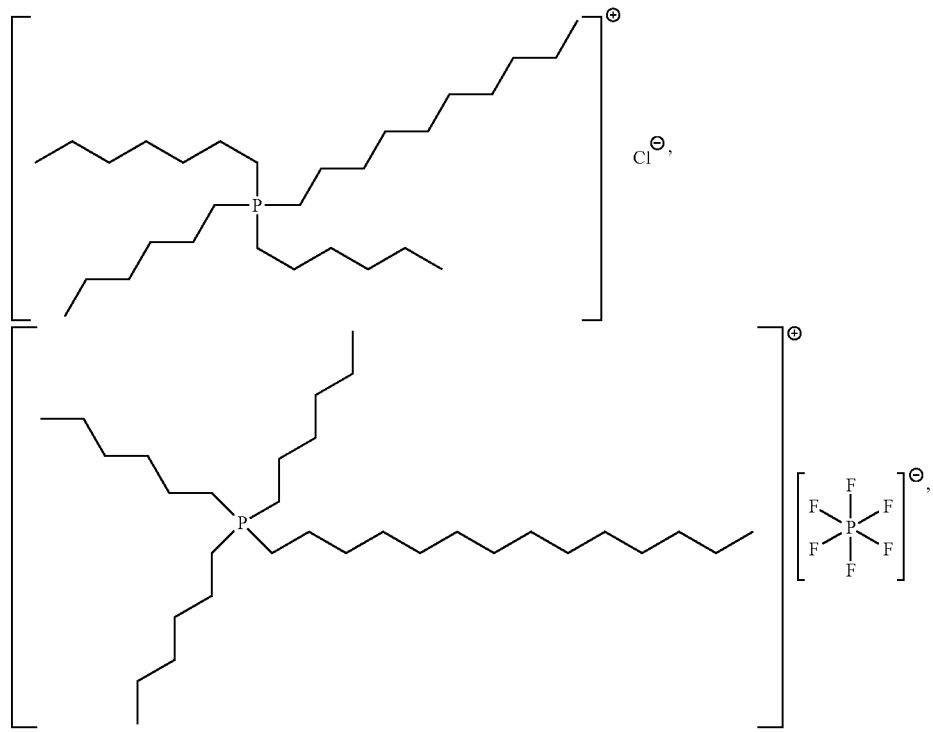

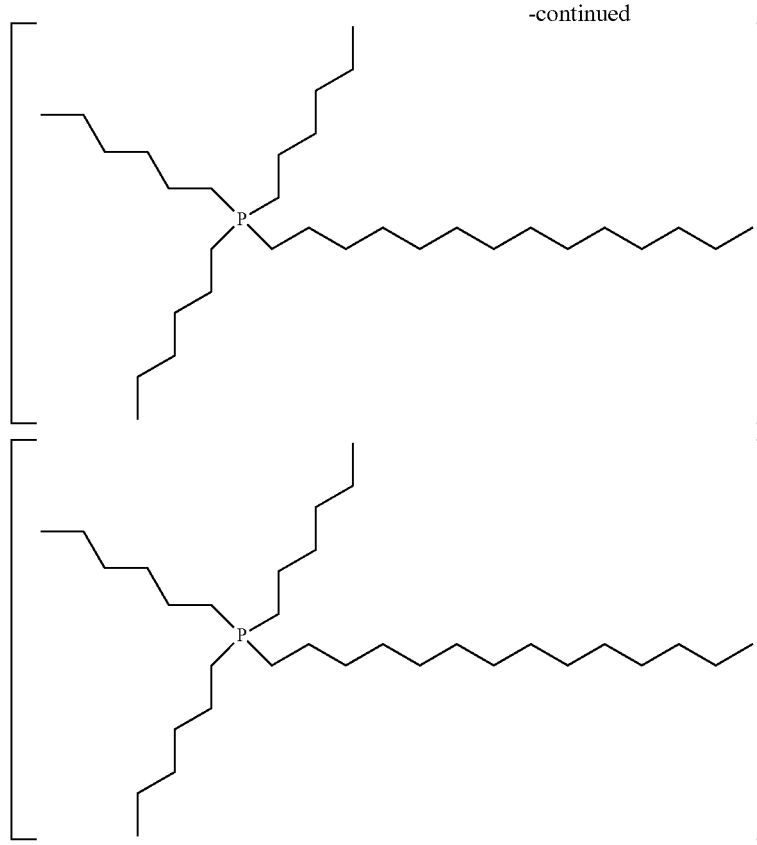
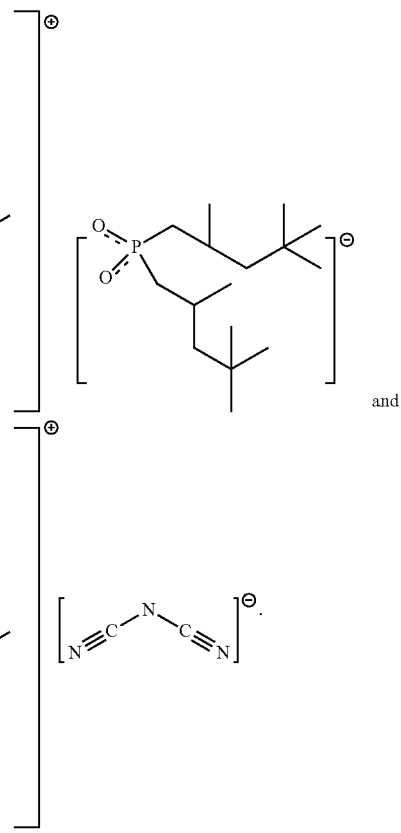

In one embodiment, the composite polymer semiconductor is prepared by the in situ polymerization of phenylacetylene or a derivative thereof, in the presence of cellulose or a cellulose derivative resulting in the composite polymer semiconductor, or by first preparing the semiconductor polymer and subsequently binding it to cellulose or a cellulose derivatives later.

The composite polymers constitute materials for low temperature fuel cell membranes and processes to make them.

In another embodiment, the process for preparing the composite polymer semiconductor is carried out by polymerizing phenylacetylene, or derivative thereof, optionally in the presence of a conductive agent, and after polymerization has occurred, coating the polymer entrained with the ionic liquid onto cellulose fibers. For example, polyphenylacetylene, or a derivative thereof, entrained with an ionic liquid, is coated on a cellulosic substrate, such as paper, forming the composite.

The following non-limiting examples are illustrative of the present invention:

EXAMPLES

Example 1: Solvent- and Catalyst-Free Polymerization of Polyphenylacetylene Using AVBN 3 g of phenylacetylene was first heated to 60° C. in a 50 mL three-neck flask equipped by a thermometer, a stirrer for gentle mixing, and a condenser. Then 0.3 g of AVBN was added and a colour change to dark orange-red was observed after one minute. The reaction mixture was cooled to RT after 4 h to give a viscous liquid. The polymerization mixtures were purified by precipitating in a large excess of methanol and the solid product was dried overnight at 50° C.

Example 2: Solvent-Free Polymerization of Polyphenylacetylene Using $WCl_6$ 3 g of phenylacetylene was first heated to 30° C. in a 50 mL three-neck flask equipped by a thermometer, a stirrer for gentle mixing, and a condenser. Then 0.05 g of $WCl_6$ was added and a colour change to dark orange-red was observed after one minute. The reaction mixture was cooled to RT after 4 h to give a viscous liquid. The polymerization mixtures were purified by precipitating in a large excess of methanol and the solid product was filtered by suction filtration.

Example 3: Characterization

Figure 7:
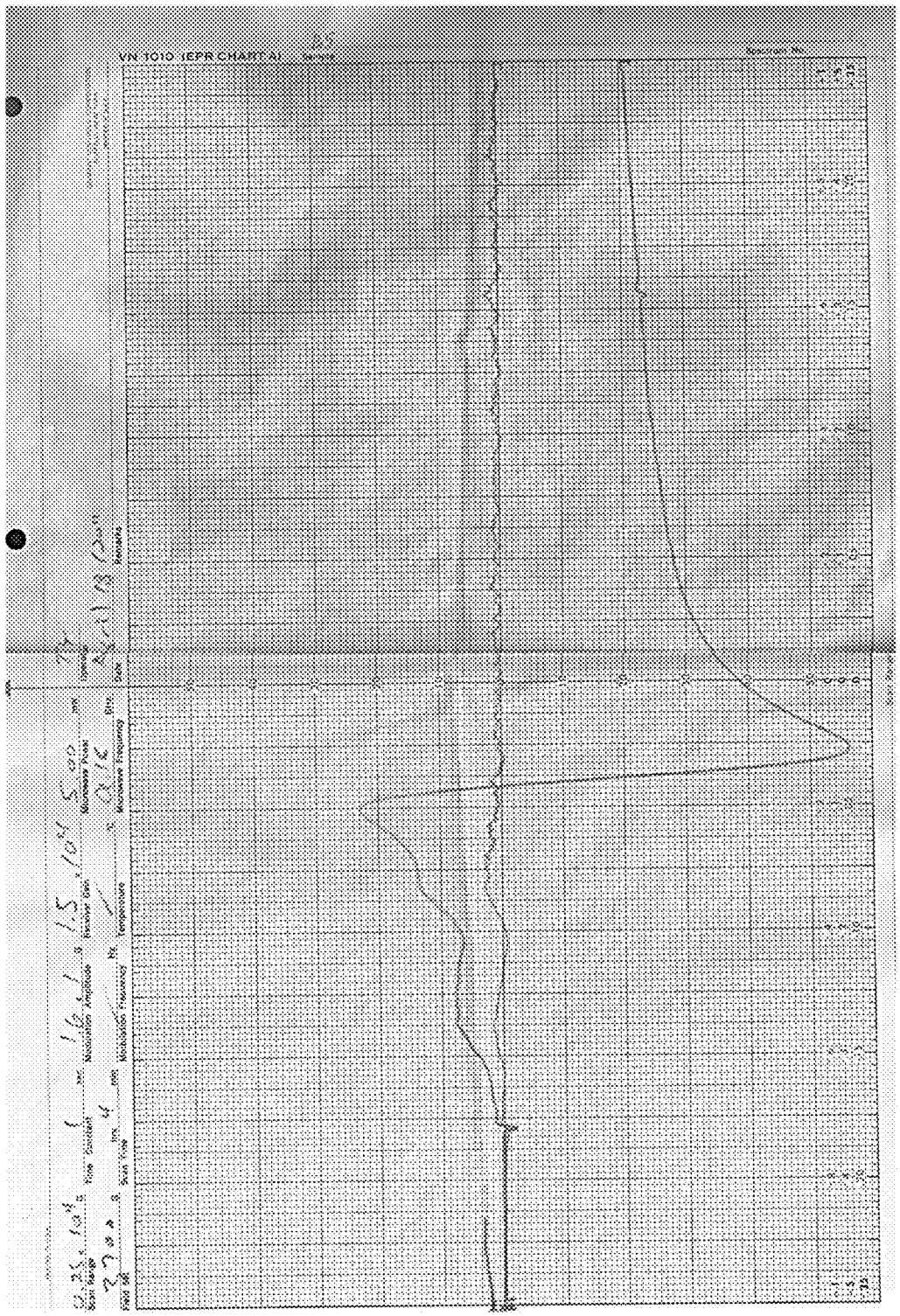
FIG. 7 is an ESR spectrum of a doped polypyrrole cellulose composite prepared in accordance with embodiments of the present disclosure.

13 C and 1H NMR spectra were recorded on a 270 MHz JEOL-JNM-GX270 NMR spectrometer, while FTIR spectra were collected from KBr pellet on a Bruker IFS 55 FTIR instrument attached with a MCT detector with a resolution of 2 cm-1 and 128 scans for each sample. Scanning electron microscopy (SEM) images and energy dispersive X-Ray (EDX) were recorded using a Hitachi S-2600N without gold coating at 10 kV. The molecular weight and PDIs were measured by gel permeation chromatography (GPC). Gel permeation chromatography (GPC) was carried out in THF (flow rate: 1 mL min-1) at 50° C. with a Polymer Labs PL-GPC 50 Plus integrated GPC system using two 300×7.8 mm Jordi gel DVB mixed bed columns and calibrated using polystyrene standards. See FIGS. 2-6. The ESR spectra shown in FIG. 7 clearly show that the composite is paramagnetic at room temperature which is expected from electron transfer reaction with the dopant that will lead to production of polarons which also cause the conductivity. The ESR spectrum was taken with an X-band ESR spectrometer. The conditions in which the spectrum is taken are written on the spectra.

Example 4: Making a Pellet

Pellets were made by blending 2.00 g of THF as a solvent, 0.05-1.00 of cellulose, 0.3-0.5 g of PPA, 0.1-0.4 g of iodine or ferric chloride as a doping agent, and 0.12-0.22 g of ionic liquid. The mixture was stirred and then dried at 40° C. The produced powder was completely crashed and then formed as a pellet by a press device.

Example 5: Coating Method to Make Semiconductor Papers

Coating technique was used to make electrically conductive papers. A piece of filter paper (1 cm×1 cm) was dipped and dried three times in the following solution:
0.3 g of PPA
3 g of THF
Iodine or ferric chloride (1/1 mole ratio)
0.1-0.4 g of Ionic Liquid.

Example 6: Purification of Monomer (e.g. Pyrrole)

98% pyrrole monomer was light yellow colour because of the existence of oxidized pyrrole. Reduced pressure distillation was used to distill pyrrole and got the pure clear pyrrole without any colours. The schematic is presented below and the temperature was controlled to about 100 C depending on the pressure. Water inlet is from 2 and outlet from 1. Part 3 was attached to a rubber tube connected with an opened faucet for reducing pressure. Pure pyrrole was sealed and stored in refrigerator.

Example 7: Dissolving Cellulose and its Derivatives 4 ml ionic liquid was added in a vial as well as the same amount of DMF. 0.15 g cellulose was added in the solution. The sample was stirred with magnet for 4 hours at 70 C. After this time, the cellulose was almost dissolved in the solution. The solution became yellowish white liquid. Ionic liquid was incorporated into cellulose based on the spectra. The fiber is extracted by mixing the solution with acetone or hexane and this can also be done with variety of organic polar and nonpolar solvent that are not ionic.

This is a new process for dissolving cellulose and its derivatives in phosphonium ionic liquids, and transforming it to valuable material such as conductive cellulose after dissolving it in ionic liquid, in situ polymerization and separation from excess ionic liquid. Although here we used the process for in situ polymerization on the surface of cellulose and its derivatives, the process is more general and can be applied to make variety of cellulose based material such as magnetic cellulose, material for super capacitors, actuators, liquid crystal polymeric material based on cellulose, etc.

Example 8: Preparation of Cellulose/Polymer Composite

Figure 8:
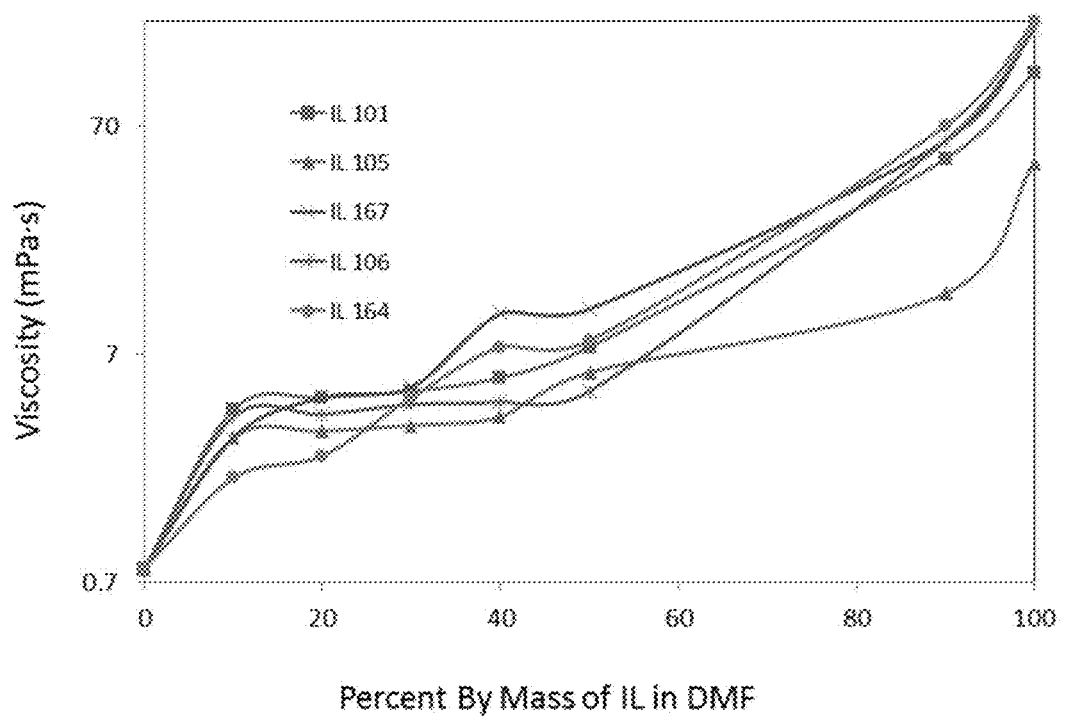
FIG. 8 shows the viscosity of ionic liquid/DMF solutions as a function of mass percent of PILs at 70° C. and ambient pressure.
Figure 9:
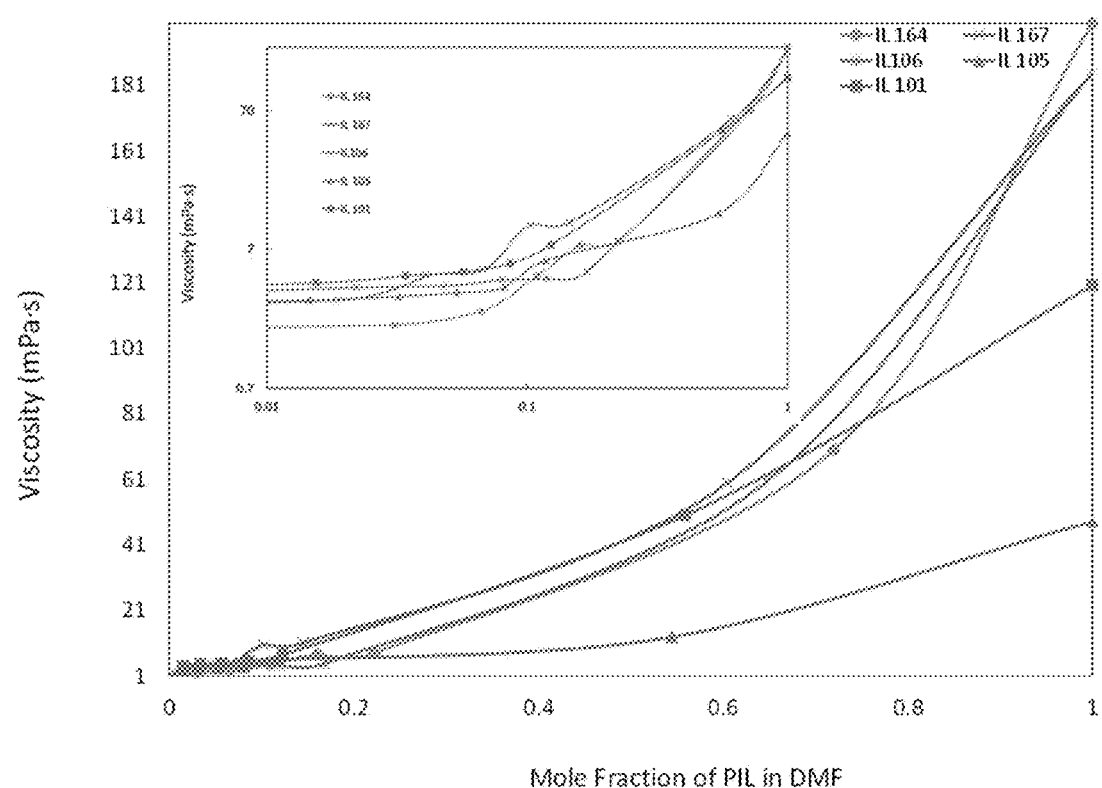
FIG. 9 shows the viscosity of ionic liquid/DMF solutions as a function of the mole fractions of PILs at 70° C. and ambient pressure.
Figure 10:
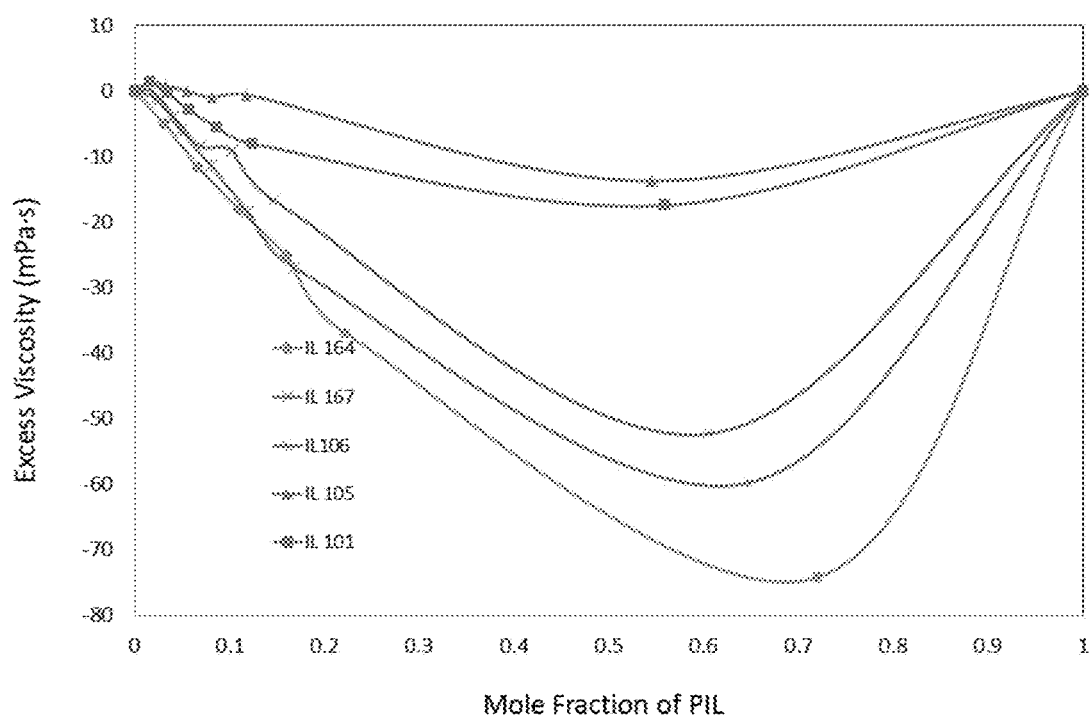
FIG. 10 shows the excess viscosity of ionic liquid/DMF solutions as a function of the mole fractions of PILs at 70° C. and ambient pressure.
Figure 11:
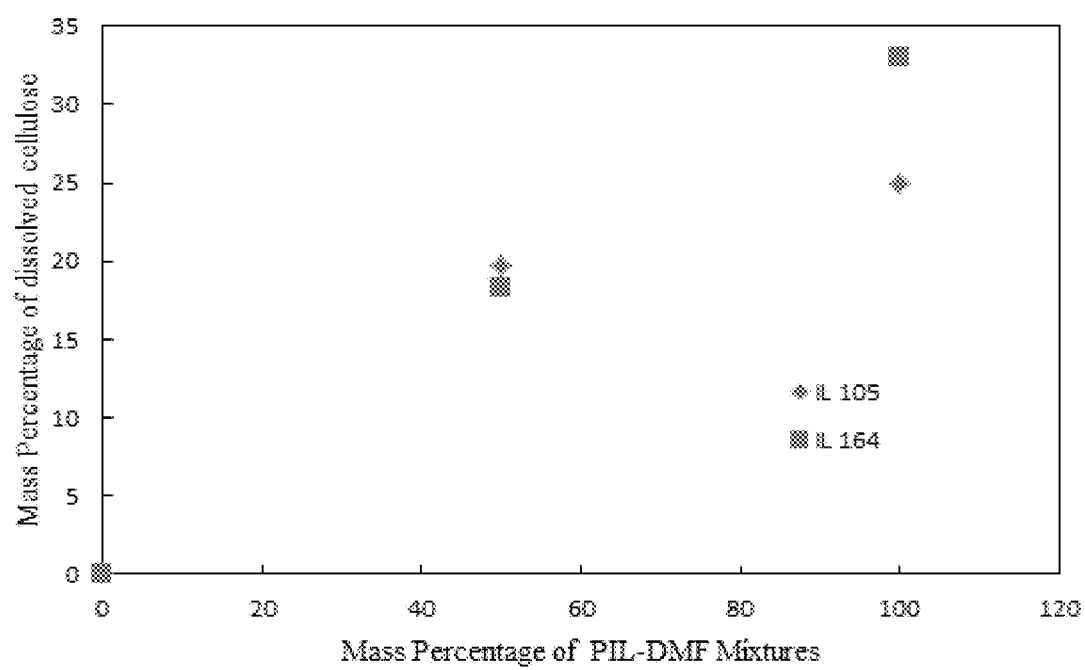
FIG. 11 shows the mass percentage of dissolved cellulose at varying concentrations of ionic liquids.
Figure 12:
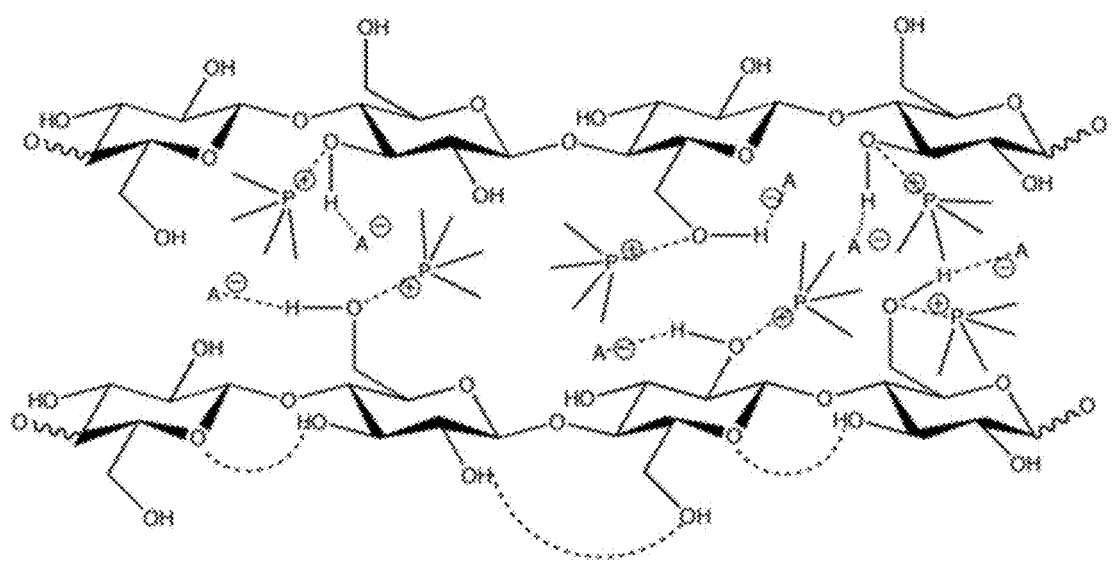
FIG. 12 shows a proposed dissolution mechanism of cellulose in ionic liquids.

After making a yellowish white solution from dissolving cellulose and its derivatives, the sample cooled to room temperature, 0.3 ml of monomer and oxidant anhydrous ferric chloride were added into solution with stirring. The reaction was continued for several hours at room temperature. The sample became dark yellow after reaction. Conductive polymer/cellulose derivative composite was obtained by washing using the protocol in 00108 to remove the liquid part and to obtain the conductive fibre. FIG. 8 shows the viscosity of ionic liquid/DMF solutions as a function of mass percent of PILs at 70° C. and ambient pressure. FIG. 9 shows the viscosity of ionic liquid/DMF solutions as a function of the mole fractions of PILs at 70 C and ambient pressure. FIG. 10 shows the excess viscosity of ionic liquid/DMF solutions as a function of the mole fractions of PILs at 70° C. and ambient pressure. FIG. 11 shows the mass percentage of dissolved cellulose at varying concentrations of ionic liquids. FIG. 12 shows a proposed dissolution mechanism of cellulose in PILs, wherein: IL 101—trihexyl(tetradecyl)phosphonium chloride; IL 105—trihexyl(tetradecyl)phosphonium dicyanamide; IL 167—tributyl(tetradecyl)phosphonium chloride; IL 106—triisobutyl(methyl)phosphonium tosylate; IL 164—tetrabutylphosphonium chloride.

Example 9: Polypyrrole Cellulose Composite 0.15 mL pyrrole and 0.7 g oxidant anhydrous ferric chloride were added into cellulose/IL 105/DMF solution with stirring. The reaction was continued for four hours at room temperature. PPy-C-IL 105 composite was washed with acetone several times until the filtrate became clear, and dried at 60° C. for 12 hours. This sample was named S1. In the sample S2, cellulose was added into 6 mL IL 105. The other preparation process is the same with S1

Figure 13:
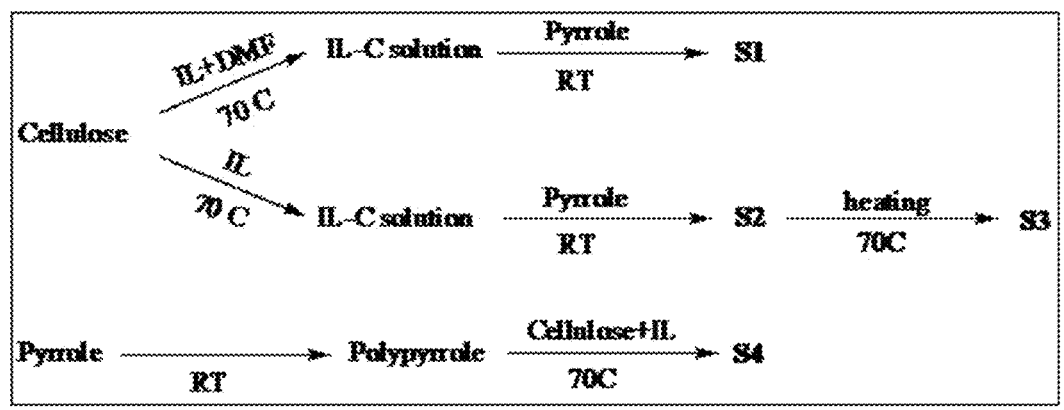
FIG. 13 is a schematic showing the preparation of various cellulose polymer composites.
Figure 14:
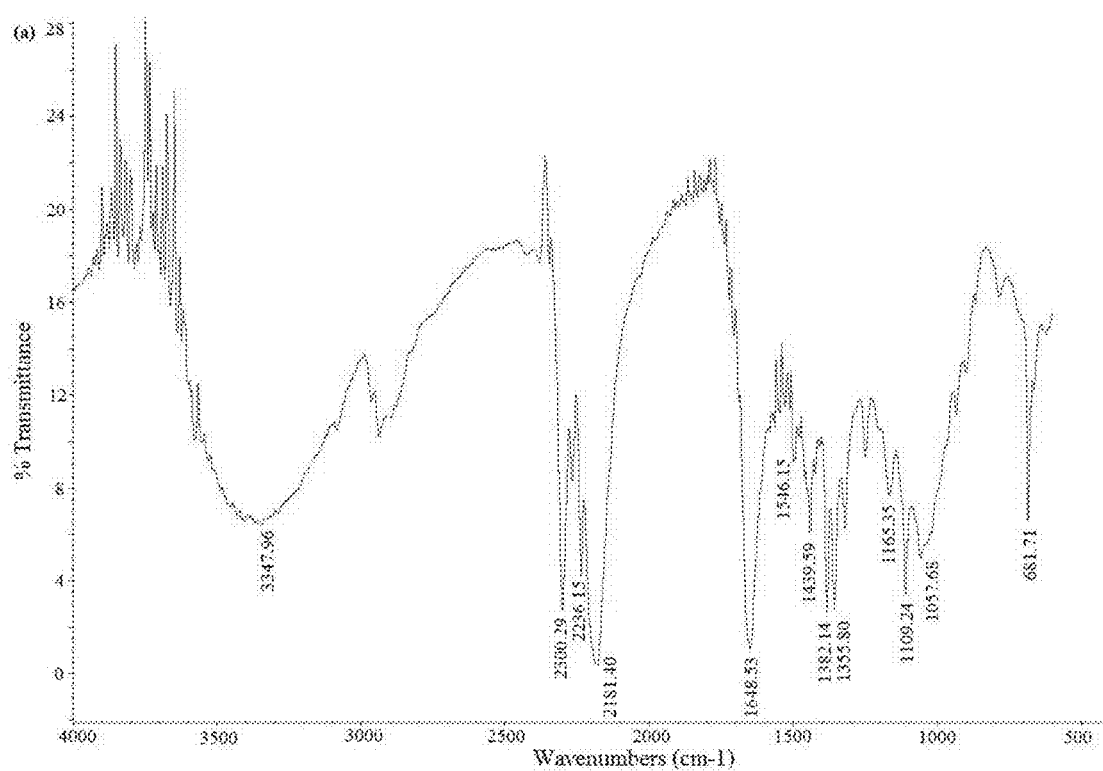
FIG. 14 is an IR spectra of a cellulose polymer composite.
Figure 15:
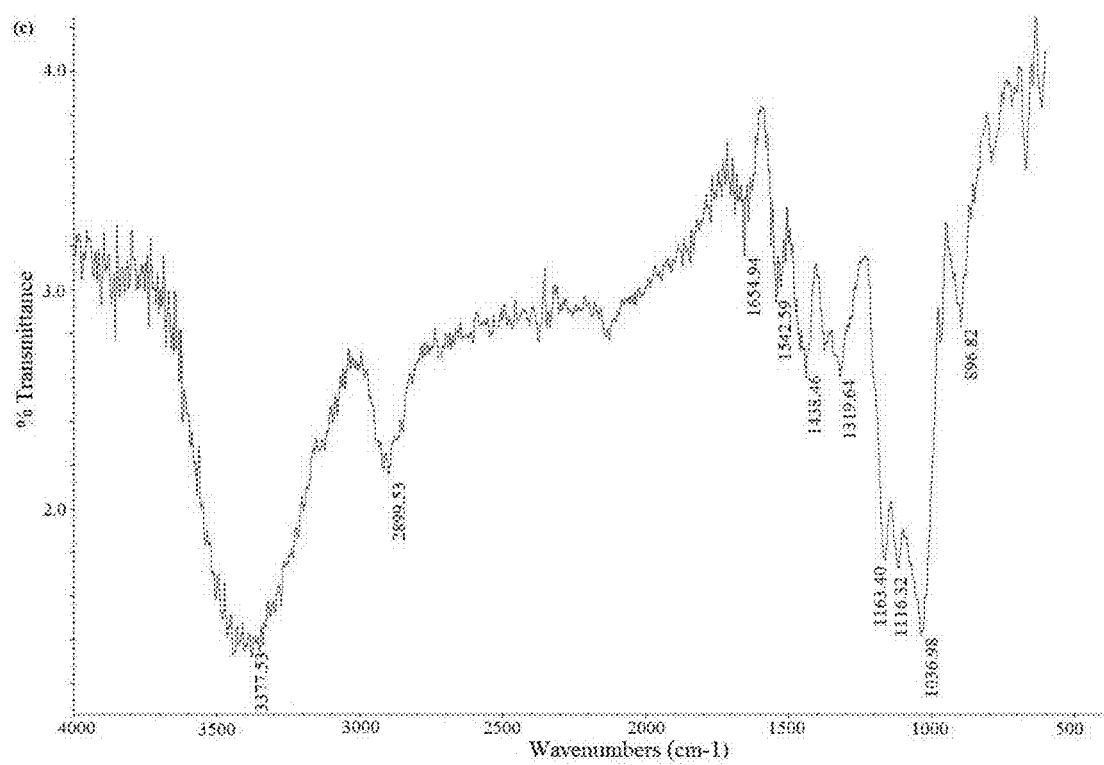
FIG. 15 is an IR spectra of a second cellulose polymer composite.
Figure 16:
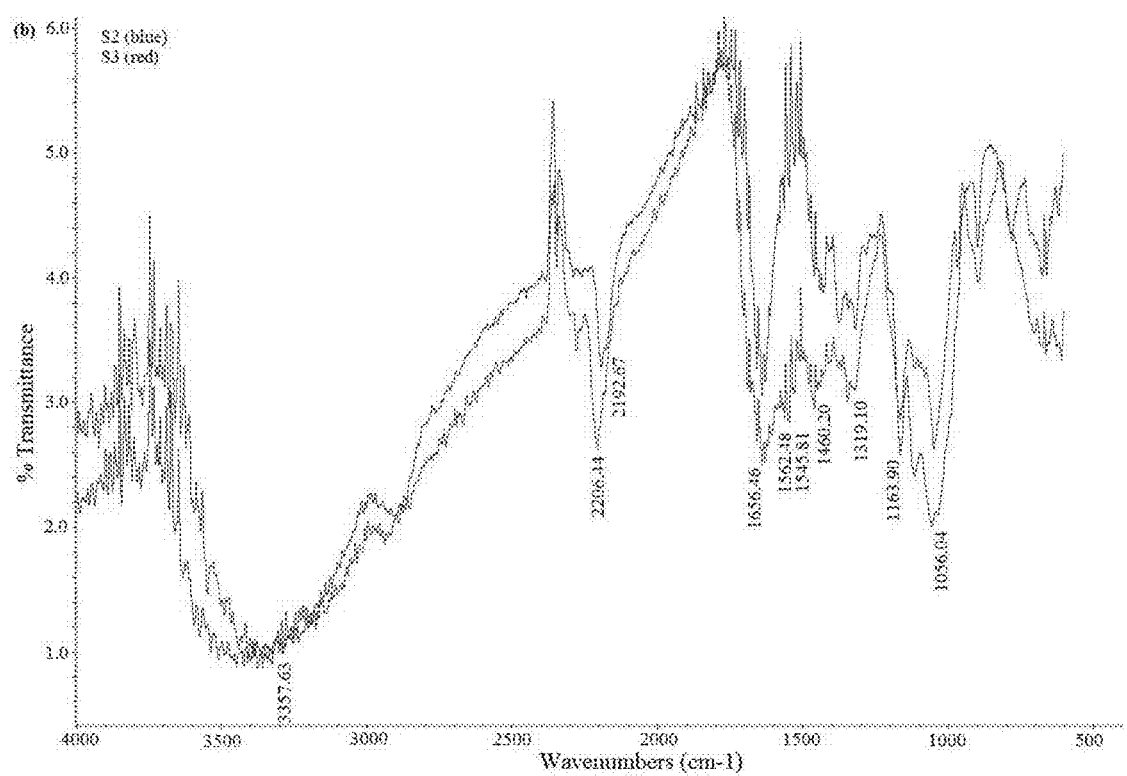
FIG. 16 is an IR spectra of a third and fourth cellulose polymer composite.
Figure 17:
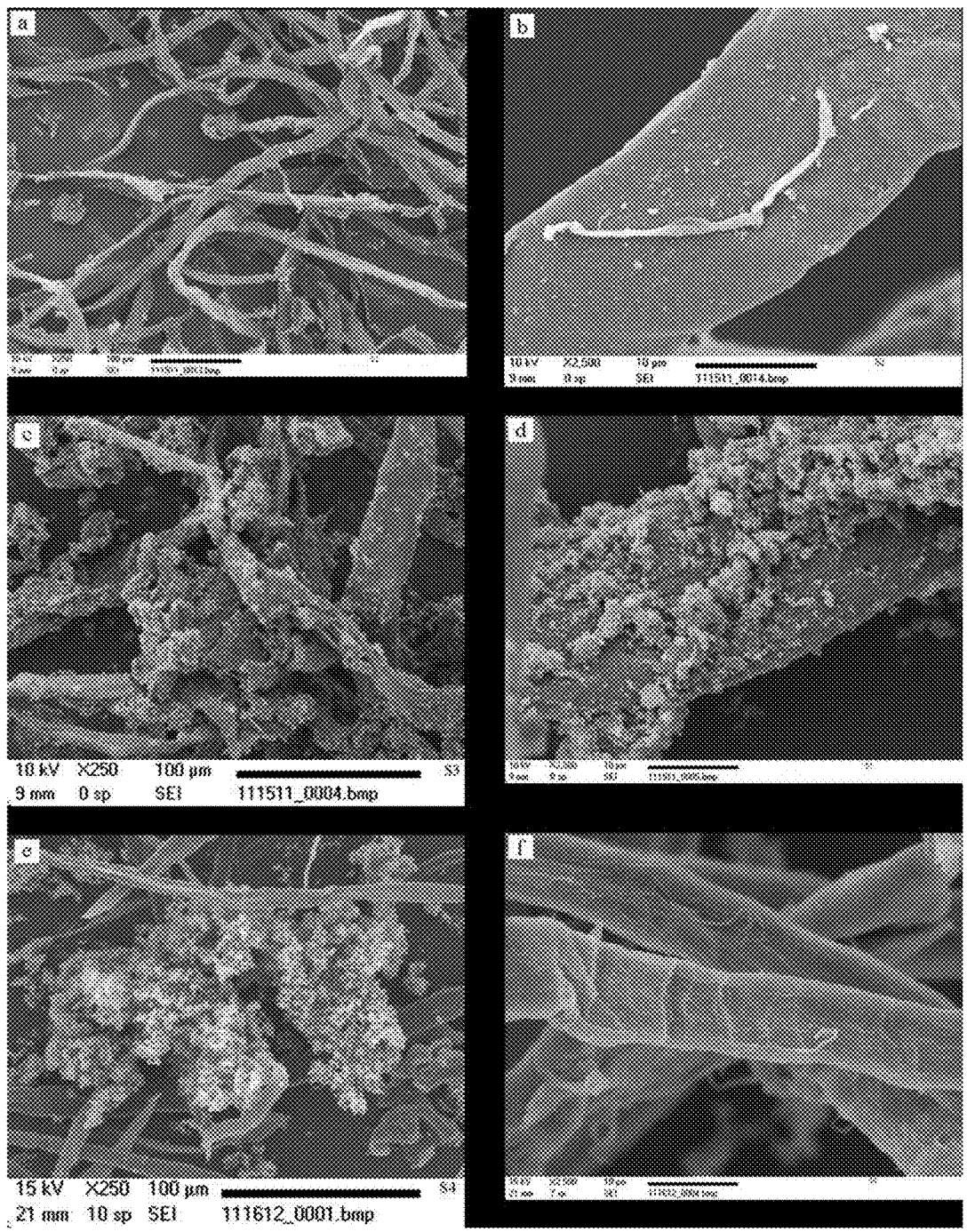
FIG. 17 are micrographs of cellulose polymer composites.
Figure 18:
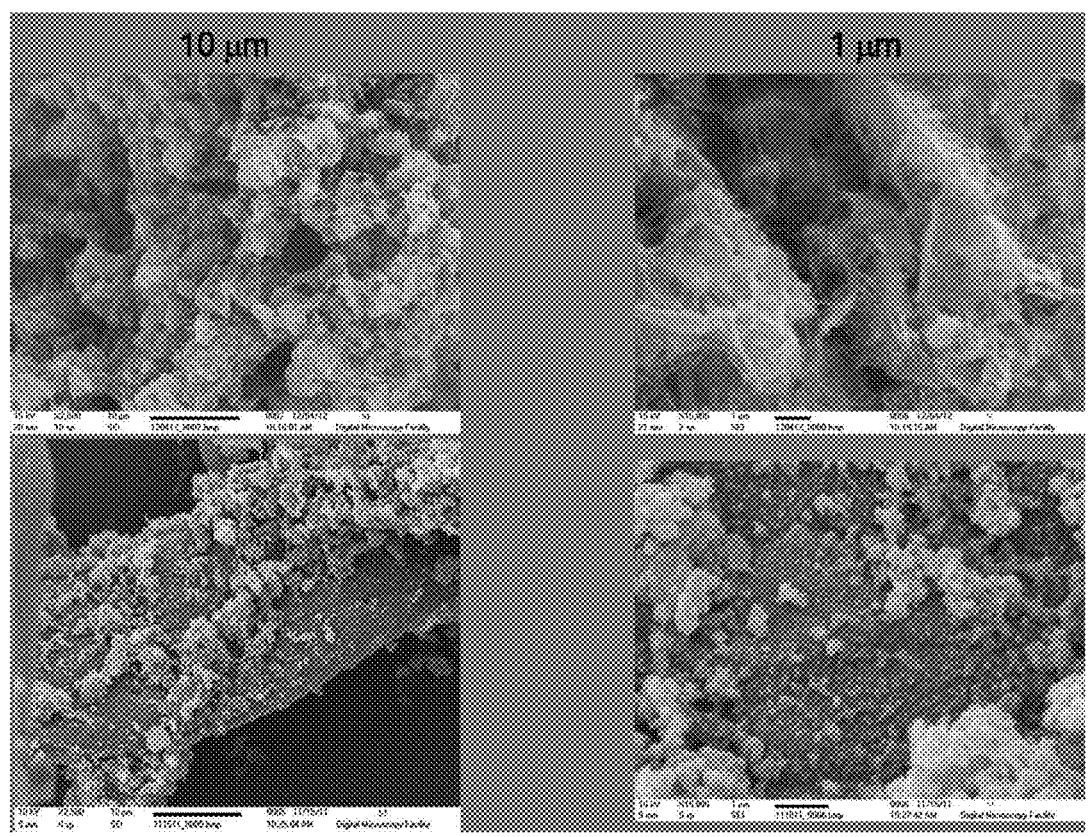
FIG. 18 are micrographs of a cellulose polymer composite.
Figure 19:
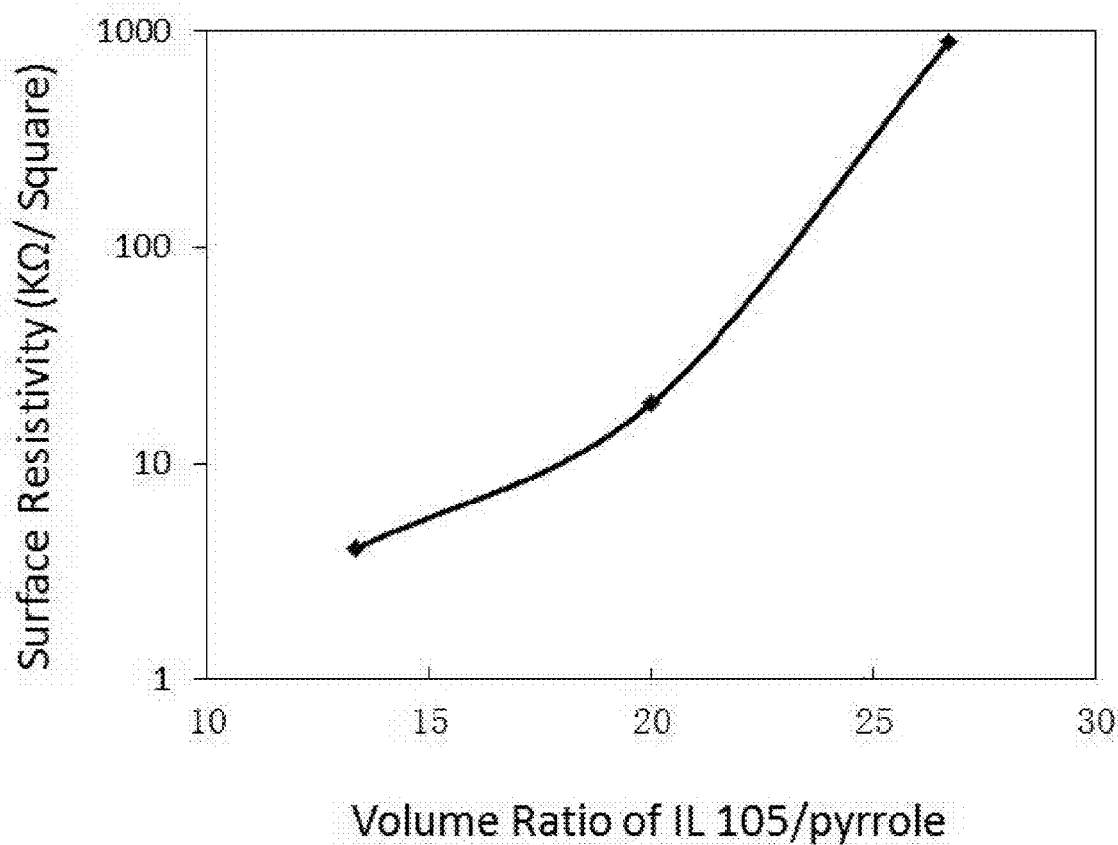
FIG. 19 is a graph showing the surface resistivity of a cellulose polymer composite.
Figure 20:
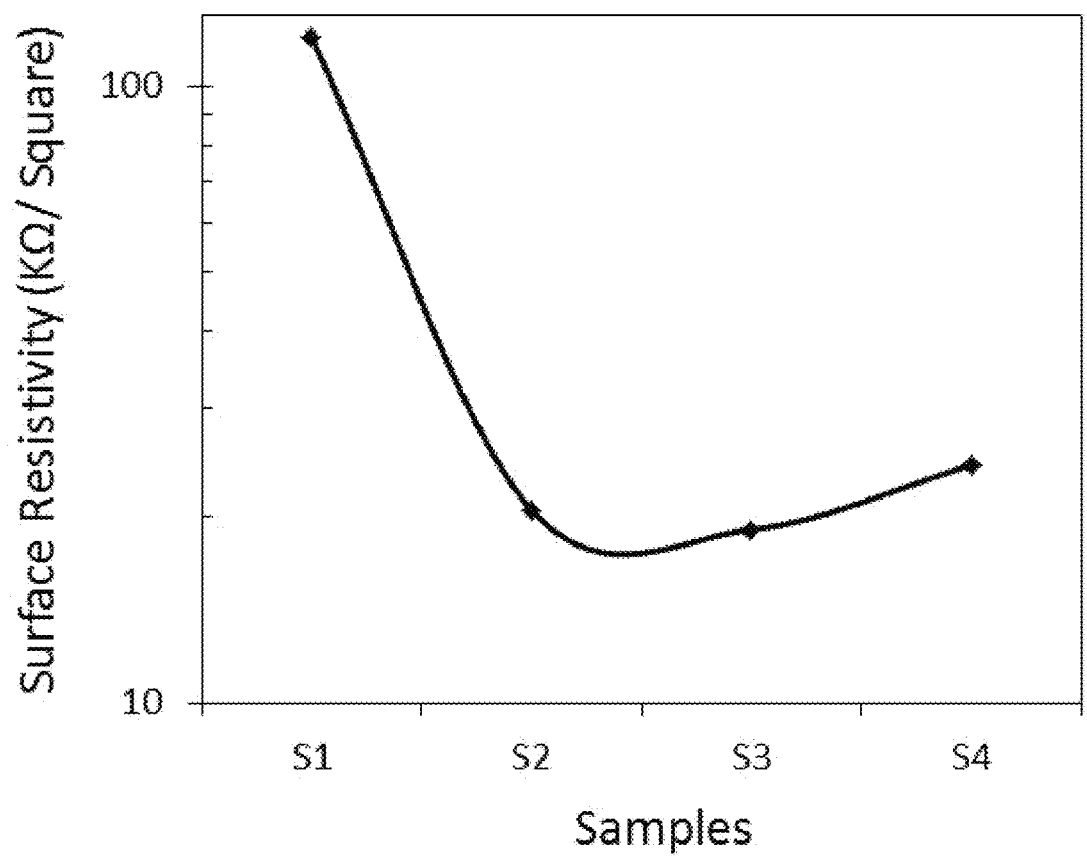
FIG. 20 is a graph showing the surface resistivity of cellulose polymer composites.

FIG. 13 is a schematic representation showing the preparation of various cellulose polymer composites S1, S2, S3 and S4. FIG. 14 is an IR spectra of S1. FIG. 15 is an IR spectra of S4. FIG. 16 is an IR spectra of S2 and S3. FIG. 17 are micrographs of cellulose polymer composites S2-S4 (top, middle, bottom). FIG. 18 are micrographs of a cellulose polymer composite S3 and S4. FIG. 19 is a graph showing the surface resistivity of a cellulose polymer composite. FIG. 20 is a graph showing the surface resistivity of cellulose polymer composites.

For S1, the broad band at 3347.96 cm$^{-1}$ relates to characteristic broad band of cellulose O—H group. [2] Peaks at 2300.57 cm$^{-1}$, 2236.15 cm$^{-1}$, 2181.40 cm$^{-1}$ and 1109.24 cm$^{-1}$ may be attributed to the IL 105 and the peak at 2236.15 cm$^{-1}$ refers to C≡N in IL 105. The C═N vibration of PPy is located at 1648.53 cm$^{-1}$. The multi peaks around 1546.15 cm$^{-1}$ relates to the C═C stretching vibration in pyrrole ring. The peak at 1439.59 cm$^{-1}$ is attributed to stretching vibration in the polypyrrole ring. The region of C—N vibration in PPy and C—H bending modes are located at 1382.14 cm$^{-1}$, 1355.80 cm$^{-1}$, and 1165.35 cm$^{-1}$. The peak at 1057.68 cm$^{-1}$ may correspond to C—O and C—O—C in cellulose.

The IR spectra of S2 and S3 are similar. Most peaks are the same, so the spectrum of S2 is cited as an example of IR spectra analysis. The peak at 3357.63 cm$^{-1}$ corresponds to a cellulose O—H group. The peak at 2192.67 cm$^{-1}$ is attributed to IL 105. The broad band from 1656.46 cm$^{-1}$ to 1639.90 cm$^{-1}$ relates to a C═N vibration in PPy. The noisy peaks between 1460 and 1560 cm$^{-1}$ correspond to the typical pyrrole rings vibration, N—H vibration, and C—N vibration. The location of the C=C vibration is at 1562.48 cm$^{-1}$ and 1545.81 cm$^{-1}$. The peaks at 1510.62 cm$^{-1}$, 1460.25 cm$^{-1}$, and 1375.56 cm$^{-1}$ are attributed to IL 105. The peaks at 1319.10 cm$^{-1}$ and 1163.90 cm$^{-1}$ are assigned to the =C—N vibration and C—H bending modes, respectively.

The IR spectrum of S4 is also very similar.

Surface resistivity—The surface resistivity decreases dramatically when the sample is prepared in the absence of DMF; this indicates that DMF affected the conductivity of the products negatively. DMF could influence the polymerization of PPy because of its nucleophilicity which would attack the cation radical of pyrrole during polymerization. The surface resistivity of S3 is lower than that of S2, indicating that heating again after polymerization helps to bind the PPy, cellulose, and IL, which is also supported by FTIR spectra.

From the figure, it seems that the volume ratio of IL 105 to Pyrrole is under 20. The surface resistivity increases with increasing the volume ratio of IL 105/pyrrole. This may be caused by the lower yield of PPy. Increasing the volume ratio of IL 105/pyrrole will decrease the concentration of pyrrole and oxidant. In addition, the viscous IL hinders the growth of the polymer chain, leading to a short chain polymer or pyrrole oligomer. The volume ratio of IL 105/pyrrole also affects the appearance of composites. When the volume ratio increases, the cellulose become soft and less coarse. This may because of the improvement of dissolution and dispersion of cellulose in the solvent. The surface resistivity shows a minimum value (4.05 KΩ/cm$^2$) at 13.33:1 (volume ratio) of IL 105/pyrrole.

SEM—Cross-linked cellulose performs like a network structure that holds PPy inside of the interspaces or being coated with PPy on the surface. PPy composites which synthesized in cellulose/IL solvent system show a clear image that cellulose is coated with PPy closely and extensively. For example, c apparently shows that PPy particles agglomerated around cellulose and filled the interspaces of cellulose. A more easily observed image FIG. d clearly shows that the nano-sized PPy particles were bound to the cellulose fibres.

It is clear that DMF at the high concentrations used in this study has a significant effect on the morphology of the composites. Most probably the decrease in conductivity is caused by fibre structures being broken by DMF

Example 9: Equipment Made for Measuring Volume Resistivity

Figure 21:
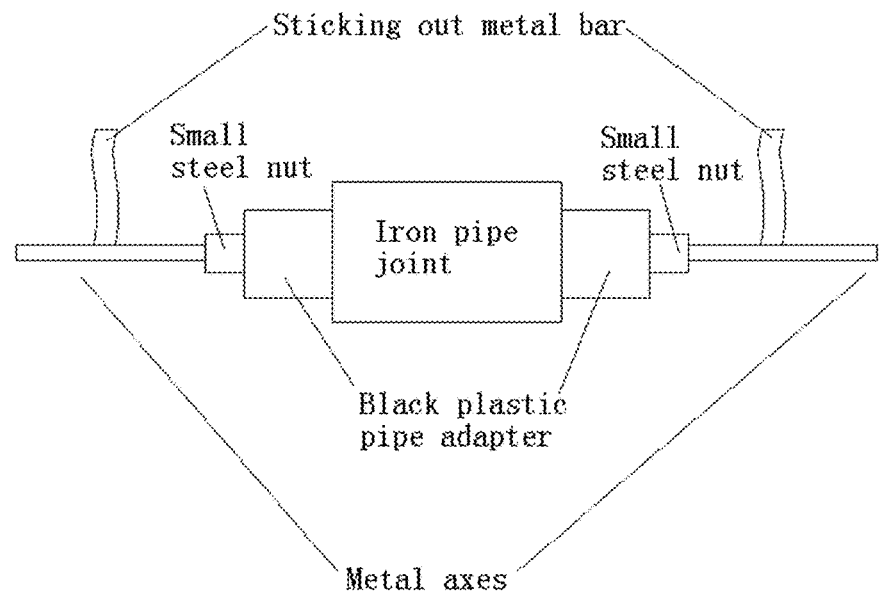
FIG. 21 is a schematic of a probe for volume resistivity/conductivity measurement. (A) shows the probe in the closed position. (B) shows the probe in the opened position.
Figure 21:
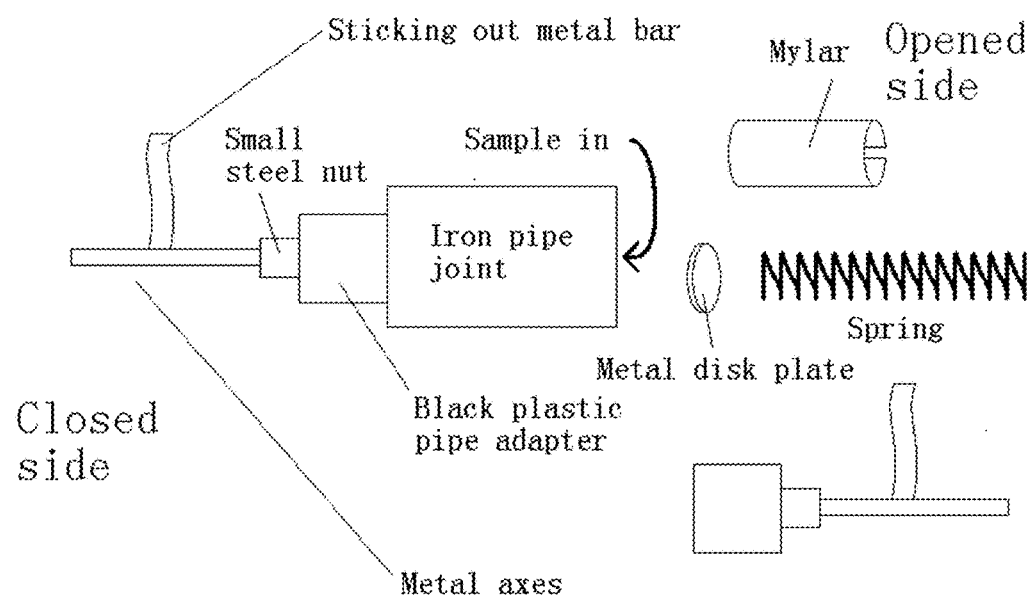

The volume resistivity (conductivity) was measured with a digital multimeter as shown in FIGS. 21(A) and 21(B). The digital multimeter was attached with a probe.

Example 10: Equipment Made for Measuring Surface Resistivity

The resistivity meter is capable of measuring surface resistivity directly by utilizing concentric ring electrodes configuration. A DC power supply provides a constant voltage V which is precisely measured by volt meter. An amp meter measures the current $I_s$ flowing between two electrodes.

Example 11: Surface Resistivity of Polymeric Solar Cells

The surface resistivity of several samples was measured two years after their preparation, and the results are shown in Table 1. The surface resistivity is calculated based on the equation which is calibrated to the surface $$\rho_i(\Omega) = 8.96 \frac{V(V)}{I_s(A)}.$$

The surface resistivity for all samples increased by a factor of 1 to 10 over 15 months in air and exposed to light meaning the material will be still active after 2 years. As the cellulose mass percent increased to more than 10 percent the conductivity did not decrease in 15 months.

Example 12a: Preparation of Patterned Polymeric Solar Cell

A 5.5 cm (#1) Whatman filter paper (pore size=11 um) was used as the base of the cell. A mound of crushed polypyrrole was carefully distributed in a switch-back fashion (following the pattern presented in FIG. 1 using an adapted pipette). Conductive ink (0.3 g PPA (polyphenylacetylene)+0.5 ml IL 101 (trihexyl(tetradecyl)phosphonium chloride)+0.02 g FeCl3+5 ml THF) was then added drop wise to surface of filter paper, ensuring good coverage and saturation of polypyrrole. The solar cell was then placed on a watchglass in the oven at 60° C. to dry. Once dry, a second application of ink was performed; followed by oven drying for two hours.

Example 12b: Preparation of Solid Polymeric Solar Cell

A 5.5 cm (#1) Whatman filter paper (pore size=11 um) was used as a base. Polypyrrole powder was ground onto surface of filter paper by hand until a homogeneous covering is achieved. Conductive ink (0.3 g PAA+0.5 ml IL 101+0.02 g FeCl3+5 ml THF) was then added dropwise to surface of filter paper until it was homogeneously distributed. The solar cell was then placed on a watchglass in the oven at 60° C. to dry. Upon drying, a second layer of polypyrrole was ground onto the surface by hand, once again ensuring a homogeneous covering. A second layer of conductive ink was applied over the surface. The solar cell was then placed on a watchglass in the oven at 60° C. to dry.

Once fabricated, the polymeric solar cells of Example 12a and 12b were connected to a voltometer and the voltage and current of the cell was measured in the absence and presence of sunlight, with the results shown in Table 2.

TABLE 1

Surface Resistivity of Polymeric Solar Cells

| Sample | Current (μA) | Voltage (V) | Surface Resistivity (kΩ/cm$^2$) |
|---|---|---|---|
| SAM 2 | 3.2 | 10 | 8358.2 |
| SAM 3 | 2.4 | 10 | 11144.3 |
| SAM 4 | 20.4 | 10 | 1311.1 |
| SAM 7 | 2.2 | 10 | 12157.4 |
| SAM 8 | 21.8 | 10 | 1226.9 |
| SAM 9 | 3.4 | 10 | 7866.5 |
| SAM 10 | 23.1 | 10 | 1157.8 |
| SAM 11 | 0.1 | 10 | 267462.7 |
| SAM 12 | 11.1 | 10 | 2409.6 |
| SAM 13 | 0.8 | 10 | 33432.8 |
| SAM 16 | 3.8 | 10 | 7038.5 |
| SAM 17 | 42.1 | 10 | 635.3 |
| SAM 18 | 3.7 | 10 | 7228.7 |

TABLE 1-continued

Surface Resistivity of Polymeric Solar Cells

| Sample | Current (μA) | Voltage (V) | Surface Resistivity (kΩ/cm²) |
|---|---|---|---|
| SAM 19 | 4.8 | 10 | 5572.1 |
| SAM 20 | 2.1 | 10 | 12157.4 |
| SAM 21 | 2.3 | 10 | 11628.8 |
| SAM 22 | 7.6 | 10 | 3519.2 |
| SAM 23 | 6.8 | 10 | 3933.3 |
| SAM 25 | 33.6 | 10 | 796 |
| SAMP7 | 0.4 | 10 | 66865.7 |
| SAMP10 | 2.7 | 10 | 9906.0 |
| SAMP 5 | 4 | 10 | 6686.6 |
| SAMP 8 | 1.1 | 10 | 24314.8 |
| SAMP11: 6% Cellulose 0.59 g PPA in MW: AVBN, 0.15 g IL105 | 5.1 | 10 | 5244.4 (decreases by a factor of 10 in 15 months) |

SAM 2: is a composite of cellulose, polyphenyl acetylene and IL 105 (trihexyl(tetradecyl) phosphonium dicyanamide) with I2 as dopant. The conductivity did not decrease after 15 months in air and sunlight. The cellulose was 20 percent. Initiator: WCl₆
SAM 3: is a composite of cellulose, polyphenyl acetylene and IL 105 with FeCl3 as dopant. The conductivity did not decrease after 15 months in air and sunlight. The cellulose was 20 percent. Initiator: WCl₆
SAM 4: is a composite of cellulose, polyphenyl acetylene and IL 105 with FeCl3 as dopant. The conductivity did not decrease after 15 months in air and sunlight. The cellulose was 18 percent. Initiator: WCl₆
SAM7: is a composite of cellulose, polyphenyl acetylene and IL 105 with I2 as dopant. The conductivity did not decrease after 15 months in air and sunlight. The cellulose was 25 percent. Initiator: WCl₆
SAM8: is a composite of cellulose, polyphenyl acetylene and IL 105 with FeCl3 as dopant. The conductivity did not decrease after 15 months in air and sunlight. The cellulose was 20 percent. Initiator: WCl₆
SAM9: is a composite of cellulose, polyphenyl acetylene and IL 105 with FeCl3 as dopant. The conductivity did decrease by a factor of two after 15 months in air and sunlight. The cellulose was 10 percent. Initiator: WCl₆
SAM10: is a composite of cellulose, polyphenyl acetylene and IL 105 with FeCl3 as dopant. The conductivity did not decrease after 15 months in air and sunlight. The cellulose was 15 percent. Initiator: WCl₆
SAM11: is a composite of cellulose, polyphenyl acetylene and IL 105 with FeCl3 as dopant. The conductivity did decrease by a factor of 10 after 15 months in air and sunlight. The cellulose was 10 percent but with decreased IL. Initiator: WCl₆
SAM12: is a composite of cellulose, polyphenyl acetylene and IL 105 with FeCl3 as dopant. The conductivity did decrease by a factor of 10 after 15 months in air and sunlight. The cellulose was 10 percent but with decreased IL. Initiator: WCl₆
SAM13: is a composite of cellulose, polyphenyl acetylene and IL 105 with FeCl3 as dopant. The conductivity did decrease by a factor of 10 after 15 months in air and sunlight. The cellulose was 2 percent. Initiator: WCl₆
SAM16: is a composite of cellulose, polyphenyl acetylene and IL 105 with FeCl3 as dopant (25% more than SAM13). The conductivity did decrease by a factor of 6 after 15 months in air and sunlight. The cellulose was 2 percent. Initiator: WCl₆
SAM17: is a composite of cellulose, polyphenyl acetylene and IL 105 with FeCl3 as dopant. The conductivity did not decrease after 15 months in air and sunlight. The cellulose was 8 percent. Initiator: WCl₆
SAM19: is a composite of cellulose, polypyrrole and IL 105 with FeCl3 as initiator and dopant. The conductivity did not decrease after 15 months in air and sunlight. The cellulose was 60 percent.
SAM20: is a composite of cellulose, polypyrrole and IL 105 with FeCl3 as initiator and dopant. The conductivity did not decrease after 15 months in air and sunlight. The cellulose was 80 percent.
SAM21: is a composite of cellulose, polypyrrole and IL 105 with FeCl3 as initiator and dopant. The conductivity did not decrease after 15 months in air and sunlight. The cellulose was 70 percent.
SAM22: is a composite of cellulose, polypyrrole and IL 105 with FeCl3 as initiator and dopant. The conductivity did not decrease after 15 months in air and sunlight. The cellulose was 40 percent.
SAM23: is a composite of cellulose, polypyrrole and IL 105 with FeCl3 as initiator and dopant. The conductivity did not decrease after 15 months in air and sunlight. The cellulose was 50 percent.
SAM25: is a composite of cellulose, polypyrrole and IL 105 with FeCl3 as initiator and dopant. The conductivity did not decrease after 15 months in air and sunlight. The cellulose was 30 percent.
SAMP5: is a composite of cellulose, polyphenyl acetylene and IL 105 with I2 as dopant. The conductivity did not decrease after 15 months in air and sunlight. The cellulose was 50 percent. Initiator: WCl₆
SAMP7: is a composite of cellulose, polyphenyl acetylene and IL 105 with FeCl3 as dopant. The conductivity did not decrease after 15 months in air and sunlight. The cellulose was 50 percent. Initiator: WCl₆
SAMP8: is a composite of cellulose, polyphenyl acetylene and IL 105 with FeCl3 as dopant. The conductivity did decrease by a factor of 2.5 after 15 months in air and sunlight. The cellulose was 40 percent. Initiator: WCl₆
SAMP10: is a composite of cellulose, polyphenyl acetylene and IL 105 with FeCl3 as dopant. The conductivity did decrease by 20 percent after 15 months in air and sunlight. The cellulose was 50 percent. Increased IL compared to SAMP8 Initiator: WCl₆

TABLE 2

Voltage and Current of Polymeric Solar Cell

| Sample | Voltage (mV) in dark | Current (μA) in dark | Voltage (mV) in sunlight | Current (μA) in sunlight | Photo-voltage (mV) | Photo-current (μA) |
|---|---|---|---|---|---|---|
| Patterned Solar Cell | 95 | 0 | 147 | 0.2 | 52 | 0.2 |
| Solid Solar Cell | 36 | 0 | 75 | 0.1 | 39 | 0.1 |

REFERENCES

1. L. Gang, R. Zhu, Y. Yang, Nature Photonics, 6, 153, 2012.
2. Y. J. Cheng et al. Chem Rev 109, 5868, 2009.
3. A. Moliton, R. C. Hioms, Polym Int 53, 1397, 2004.
4. C. Deibel, V. Dyakonov, Rep Prog Phys 73, 096401, 2010.
5. G. Dennler, M. C. Scharber, C. J. Brabec Adv Mater 21, 1, 2009.
6. B. C. Thompson, J. M. J Fréchet, Angew Chem Int Ed 47, 58, 2008.
7. S. A. Jenekhe, S. Yi, Appl. Phys. Lett. 77, 2635, 2000.
8. G. Yu, A. Heeger, J. Appl. Phys. Lett. 78, 4510, 1995.
9. M. Granström et al. Nature 395, 257, 1998.
10. J. J. M Halls, R. H. Friend, Synth. Met. 85, 1307, 1997.
11. N. S. Sariciftci et al. Appl. Phys. Lett. 62, 585, 1993.

The invention claimed is:

1. A composite polymer, comprising:
   a) a cellulose composite comprising
      i) cellulose or a cellulose derivative;
      ii) a phosphonium ionic liquid; and
      iii) a conductive polymer; and
   b) optionally, an electrically conductive dopant,
wherein the cellulose or cellulose derivative is dissolved in the phosphonium ionic liquid and the phosphonium ionic liquid is incorporated into the cellulose or cellulose derivative, and the cellulose or cellulose derivative is bound to the conductive polymer.

2. The composite polymer of claim 1, wherein the phosphonium ionic liquid has the structure

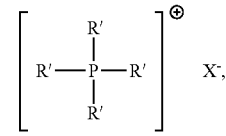

wherein
each R' is independently or simultaneously $C_{1-20}$alkyl and
X is any suitable anionic ligand.

3. The composite polymer of claim 2, wherein the phosphonium ionic liquid is tetradecyl(trihexyl)phosphonium chloride, tetradecyl(trihexyl)phosphonium bromide, tetradecyl(trihexyl)phosphonium decanoate, tetradecyl(trihexyl) phosphonium(bis 2,4,4-trimethylpentyl)phosphinate, tetradecyl(trihexyl)phosphonium dicyanamide, triisobutyl (methyl)phosphonium tosylate, tributyl(methyl) phosphonium methylsulfate, tetradecyl(trihexyl) phosphonium bistriflamide, tetradecyl(trihexyl) phosphonium hexafluorophosphate, tetradecyl(trihexyl) phosphonium tetrafluoroborate, tributyl(hexadecyl) phosphonium bromide, tetrabutylphosphonium bromide, tetrabutylphosphonium chloride, tetraoctylphosphonium bromide, tetradecyl(tributyl)phosphonium chloride, ethyltri (butyl)phosphonium diethylphosphate, tetradecyl(tributyl) phosphonium dodecylsulfonate or tetradecyl(trihexyl)phosphonium dodecylsulfonate.

4. The composite polymer of claim 1, wherein the conductive polymer is polyaniline, polypyrrole, poly(p-phenylene-vinylene), poly(thiophene), poly(fluorene), polyphenylene, polypyrene, polyazulene, polynaphthalene, polycarbazole, polyindole, derivatives, or copolymers thereof.

5. The composite polymer of claim 1, wherein the conductive polymer comprises an optionally substituted 5- or 6-membered heteroaromatic ring, wherein the optional substituents are selected independently or simultaneously from one, two or three of halo, $(C_{1-6})$-alkyl, or fluoro-substituted $(C_{1-6})$-alkyl.

6. The composite polymer of claim 5, wherein the heteroaromatic polymer is of the formula (III)

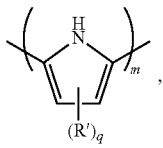

wherein R' is independently or simultaneously halo, (C1-6)-alkyl, or fluoro-substituted $(C_{1-6})$-alkyl;
q is 0, 1 or 2; and
m is an integer greater than or equal to 100.

7. The composite polymer of claim 6, wherein the polymer of the formula (III) is

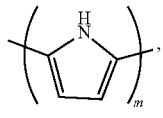

wherein m is an integer which is greater than or equal to 100.

8. The composite polymer of claim 1, wherein the electrically conductive dopant is iodine ($I_2$), iron trichloride ($FeCl_3$), a metal naphtalide, $AgClO_4$, gaseous $O_2$, $H_2O_2$, benzoquinone, $AsF_5$, metal powder, dodecylbenzenesulfonic acid (dbsa), indigo carmine, 2,2'-azino-bis(3-ethylbenzothiazoline-6-sulfonate) (abts), p-toluenesulfonic acid, and its sodium salt (ptsa and ptsa-na), benzenesulfonic acid (bsa), para-toluene sulphonate, or combinations thereof.

9. A polymeric solar cell, comprising:
a. a first electrode comprising a composite polymer as defined in claim 1;
b. a second electrode comprising a composite polymer semiconductor,
wherein the composite polymer semiconductor comprises:
b.i. cellulose or a cellulose derivative;
b.ii. polyphenylacetylene or a derivative thereof, or a metal polystyrene nanoparticle; and
b.iii optionally, a second electrically conductive dopant.

10. The polymeric solar cell of claim 9, wherein the first electrode is in contact with the second electrode.

11. The polymeric solar cell according to claim 9, wherein the conductive polymer is polyaniline, poly(p-phenylene-vinylene), poly(thiophene), poly(fluorene), polyphenylene, polypyrene, polyazulene, polynaphthalene, polycarbazole, polyindole, poly(p-phenylene sulfide), derivatives, copolymers, or cellulose composites thereof.

12. The polymeric solar cell according to claim 9, wherein the conductive polymer comprises an optionally substituted 5- or 6-membered heteroaromatic ring, wherein the optional substituents are selected independently or simultaneously from one, two or three of halo, $(C_{1-6})$-alkyl, or fluoro-substituted $(C_{1-6})$-alkyl.

13. The polymeric solar cell according to claim 11, wherein the heteroaromatic polymer is of the formula (III)

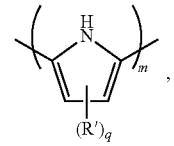

wherein R' is independently or simultaneously halo, (C1-6)-alkyl, or fluoro-substituted $(C_{1-6})$-alkyl;
q is 0, 1 or 2; and
m is an integer greater than or equal to 100.

14. The polymeric solar cell according to claim 9, wherein the electrically conductive dopant is iodine ($I_2$), iron trichloride ($FeCl_3$), a metal naphtalide, $AgClO_4$, gaseous $O_2$, $H_2O_2$, benzoquinone, $AsF_5$, metal powder, dodecylbenzenesulfonic acid (dbsa), indigo carmine, 2,2'-azino-bis(3-ethylbenzothiazoline-6-sulfonate) (abts), p-toluenesulfonic acid, and its sodium salt (ptsa and ptsa-na), benzenesulfonic acid (bsa), para-toluene sulphonate, or combinations thereof.

15. The polymeric solar cell of claim 9, wherein the polystyrene or derivative thereof is of the formula (IV)

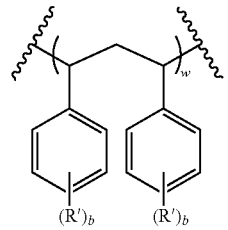

wherein R' is independently or simultaneously halo or $(C_{1-6})$-alkyl, the latter group being optionally substituted by halo, $(C_{1-2})$-alkyl or fluoro-substituted $(C_{1-2})$-alkyl;
b is 0, 1, 2, 3 4, or 5;
w is an integer between 100 to 100,000; and the polymer includes metal nano particles; and wherein the polyphenylacetylene or polyphenylacetylene derivative is of the formula (V):

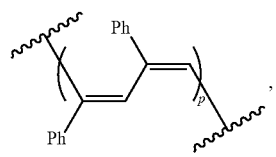

wherein Ph and the alkene is optionally substituted, the optional substituents are simultaneously or independently selected from one to five of Si, Ge, halo, optionally substituted $(C_{1-6})$-alkyl, optionally substituted $(C_{1-6})$-alkoxy, optionally substituted $(C_{6-14})$-aryl, optionally substituted $(C_{5-14})$-heteroaryl, nitro, and —$NR^1R^2$ wherein $R^1$ and $R^2$ are independently or simultaneously H, $(C_{1-6})$-alkyl or $(C_{6-14})$-aryl, and
p is an integer between 100 to 50,000.

16. The polymeric solar cell of claim 14, wherein the polystyrene has the structure

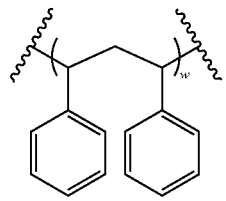

w is an integer between 100 to 100,000,
and polyphenylacetylene has the structure
or

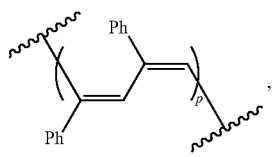

wherein Ph is unsubstituted phenyl, and
p is an integer between 100 to 50,000.

17. The polymeric solar cell according to claim 9, wherein the second electrically conductive dopant is iodine ($I_2$), iron trichloride ($FeCl_3$), a metal naphtalide, $AgClO_4$, gaseous $O_2$, $H_2O_2$, benzoquinone, $AsF_5$, metal powder, dodecylbenzenesulfonic acid (dbsa), indigo carmine, 2,2'-azino-bis(3-ethyl-benzothiazoline-6-sulfonate) (abts), p-toluenesulfonic acid, and its sodium salt (ptsa and ptsa-na), benzenesulfonic acid (bsa), para-toluene sulphonate, or combinations thereof.

18. The polymeric solar cell of claim 9, wherein the first electrode has an electron conductivity of between 0.0001 and 10.0 S/cm.

19. The polymeric solar cell of claim 9, wherein the polymeric solar cell is substantially biodegradable.

20. The polymeric solar cell of claim 9, wherein the first electrode is coated with an ionic liquid layer, in which carbon nanotubes are optionally dissolved in the ionic liquid.

21. A process for dissolving cellulose or a cellulose derivative in a phosphonium ionic liquid for the preparation of a composite polymer as claimed in claim 1, the process comprising:

(i) mixing the cellulose or cellulose derivative with the phosphonium ionic liquid under conditions for the dissolution of the cellulose or cellulose derivative in the ionic liquid,
(ii) obtaining a composite comprising the cellulose or cellulose derivative incorporated with the ionic liquid; and
(iii) mixing the composite with a monomer of a conductive polymer to obtain the composite polymer, wherein the cellulose or cellulose derivative is bound to the conductive polymer.

22. The process of claim 20, wherein the ionic liquid is further mixed with a co-solvent, wherein the composite is also incorporated with the co-solvent, and wherein the co-solvent is dimethyl formamide (DMF).

23. The process of claim 20, wherein the cellulose or cellulose derivative is mixed with the ionic liquid at a temperature between 50° C. and 100° C.

24. The process of claim 20, wherein the cellulose or cellulose derivative is mixed with the ionic liquid for a time between 3-6 hours.

25. The process of claim 20, wherein the phosphonium ionic liquid has the structure

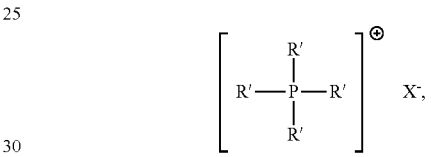

wherein
each R' is independently or simultaneously $C_{1-20}$alkyl and X is any suitable anionic ligand.

26. The process of claim 20, wherein the phosphonium ionic liquid is tetradecyl(trihexyl)phosphonium chloride, tetradecyl(trihexyl)phosphonium bromide, tetradecyl(trihexyl)phosphonium decanoate, tetradecyl(trihexyl)phosphonium(bis 2,4,4-trimethylpentyl)phosphinate, tetradecyl(trihexyl)phosphonium dicyanamide, triisobutyl(methyl)phosphonium tosylate, tributyl(methyl)phosphonium methylsulfate, tetradecyl(trihexyl)phosphonium bistriflamide, tetradecyl(trihexyl)phosphonium hexafluorophosphate, tetradecyl(trihexyl)phosphonium tetrafluoroborate, tributyl(hexadecyl)phosphonium bromide, tetrabutylphosphonium bromide, tetrabutylphosphonium chloride, tetraoctylphosphonium bromide, tetradecyl(tributyl)phosphonium chloride, ethyltri(butyl)phosphonium diethyiphosphate, tetradecyl(tributyl)phosphonium dodecylsulfonate or tetradecyl(trihexyl)phosphonium dodecylsulfonate.

27. The process of claim 20, wherein the composite is further mixed with a free radical initiator.

* * * * *